(12) United States Patent
Pillarisetty et al.

(10) Patent No.: US 11,557,630 B2
(45) Date of Patent: Jan. 17, 2023

(54) QUANTUM DOT DEVICES WITH SELECTORS

(71) Applicant: Intel Corporation, Santa Clara, CA (US)

(72) Inventors: Ravi Pillarisetty, Portland, OR (US); Nicole K. Thomas, Portland, OR (US); Abhishek A. Sharma, Hillsboro, OR (US); Hubert C. George, Portland, OR (US); Jeanette M. Roberts, North Plains, OR (US); Zachary R. Yoscovits, Beaverton, OR (US); Roman Caudillo, Portland, OR (US); Kanwaljit Singh, Rotterdam (NL); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 302 days.

(21) Appl. No.: 16/643,322

(22) PCT Filed: Sep. 28, 2017

(86) PCT No.: PCT/US2017/053919
§ 371 (c)(1),
(2) Date: Feb. 28, 2020

(87) PCT Pub. No.: WO2019/066843
PCT Pub. Date: Apr. 4, 2019

(65) Prior Publication Data
US 2020/0365656 A1     Nov. 19, 2020

(51) Int. Cl.
*H01L 27/24*     (2006.01)
*H01L 45/00*     (2006.01)
(Continued)

(52) U.S. Cl.
CPC ......... *H01L 27/2463* (2013.01); *G06N 10/00* (2019.01); *H01L 29/122* (2013.01);
(Continued)

(58) Field of Classification Search
None
See application file for complete search history.

(56) References Cited

U.S. PATENT DOCUMENTS

| 2002/0179897 A1 | 12/2002 | Eriksson et al. |
| 2006/0170053 A1 | 8/2006 | Yeo et al. |
(Continued)

FOREIGN PATENT DOCUMENTS

| JP | 2004363587 A | 12/2004 |
| WO | 2017155531 A1 | 9/2017 |
(Continued)

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
(Continued)

*Primary Examiner* — Scott B Geyer
(74) *Attorney, Agent, or Firm* — Akona IP PC

(57) ABSTRACT

Disclosed herein are quantum dot devices and techniques. In some embodiments, a quantum computing processing device may include a quantum well stack, an array of quantum dot gate electrodes above the quantum well stack, and an associated array of selectors above the array of quantum dot gate electrodes. The array of quantum dot gate electrodes and the array of selectors may each be arranged in a grid.

12 Claims, 22 Drawing Sheets

(51) Int. Cl.
*G06N 10/00* (2022.01)
*H01L 29/12* (2006.01)
*H01L 29/15* (2006.01)
*H01L 29/43* (2006.01)
*H01L 29/778* (2006.01)
*H01L 29/66* (2006.01)
*H01L 29/423* (2006.01)

(52) U.S. Cl.
CPC ........ *H01L 29/152* (2013.01); *H01L 29/4232* (2013.01); *H01L 29/437* (2013.01); *H01L 29/66977* (2013.01); *H01L 29/778* (2013.01); *H01L 29/7782* (2013.01); *H01L 45/1206* (2013.01); *H01L 45/1233* (2013.01)

(56) References Cited

U.S. PATENT DOCUMENTS

| | | |
|---|---|---|
| 2010/0006821 A1 | 1/2010 | Choi et al. |
| 2011/0128779 A1 | 6/2011 | Redaelli et al. |
| 2012/0074386 A1 | 3/2012 | Rachmady et al. |
| 2013/0264617 A1 | 10/2013 | Joshi et al. |
| 2015/0236284 A1 | 8/2015 | Chan et al. |
| 2019/0006572 A1 | 1/2019 | Falcon et al. |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |

FOREIGN PATENT DOCUMENTS

| | | |
|---|---|---|
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |
| WO | 2018182571 A1 | 10/2018 |
| WO | 2018182584 A1 | 10/2018 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |
| WO | 2018236404 A1 | 12/2018 |
| WO | 2018236405 A1 | 12/2018 |
| WO | 2019004990 A1 | 1/2019 |
| WO | 2019004991 A1 | 1/2019 |
| WO | 2019032114 A1 | 2/2019 |
| WO | 2019032115 A1 | 2/2019 |
| WO | 2019055038 A1 | 3/2019 |
| WO | 2019066840 A1 | 4/2019 |
| WO | 2019066843 A1 | 4/2019 |

OTHER PUBLICATIONS

"A two-qubit logic gate in silicon," Veldhorst et al., Nature, vol. 526, Oct. 15, 2015, pp. 410-414.

"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

"Fast sensing of double-dot charge arrangement and spin state with an rf sensor quantum dot," Barthel et al, Materials Department, University of California, Santa Barbara, Jan. 16, 2014, 4 pages.

"Undoped accumulation-mode Si/SiGe quantum dots," Borselli et al, HRL Laboratories, LLC., Jul. 15, 2014, 4 pages.

"Spin Relaxation and Decoherence of Holes in Quantum Dots," Bulaev et al., Phys. Rev. Lett. 95, 076805, Aug. 11, 2005, 1 page.

"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.

"Ultrafast optical control of individual quantum dot spin qubits," De Greve et al, Reports on Progress in Physics, vol. 76, No. 9, Sep. 4, 2013, 2 pages.

"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.

"How it's built: Micron/Intel3D NAND Micron Opens the Veil a Little," Moyer, Bryon, retrieved from https://www.eejournal.com/article/20160201-micron/ on Nov. 29, 2017, 9 pages.

"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.

"Platinum single-electron transistors with tunnel barriers made by atomic layer deposition", George et al., Department of Electrical Engineering, University of Notre Dame, Published Nov. 5, 2010, 3 pages.

"Quantum computation with quantum dots," Loss et al , Physical Review A, vol. 57, No. 1, Jan. 1998, pp. 120-126.

(56) References Cited

OTHER PUBLICATIONS

"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Defect reduction of selective Ge epitaxy in trenches on Si(001) substrates using aspect ratio trapping," Park et al., Applied Physics Letter 90, 052113 (2007), pp. 052113-1 through 052113-3.
"Photon- and phonon-assisted tunneling in the three-dimensional charge stability diagram of a triple quantum dot array," Braakman et al., Applied Physics Letters 102, 112110 (2013), pp. 112110-1 through 112110-4 (5 pages with cover sheet).
"Radio frequency measurements of tunnel couplings and singlet-triplet spin states in Si:P quantum dots," House et al., Nature Communications, 6:884, DOI: 10.1038/ncomms 9848, Nov. 9, 2015, pp. 1-6.
"Detecting bit-flip errors in a logical qubit using stabilizer measurements," Riste et al., Nature Communications, 6:6983, DOI: 10.1038/ncomms7983, Apr. 29, 2015, pp. 1-6.
"Scalable gate architecture for densely packed semiconductor spin qubits," Zajac et al, Department of Physics, Princeton University; Sandia National Laboratories, retrieved [cond-mat.mes-hall] Jul. 24, 2016, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 113104-3.
"Single-shot read-out of an individual electron spin in a quantum dot," Elzerman et al., Nature, vol. 430, Jul. 22, 2004, pp. 431-435.
"An addressable quantum dot qubit with fault-tolerant control-fidelity," Veldhorst et al., Nature Nanotechnology vol. 9, Dec. 2014, pp. 981-985.
PCT International Search Report and Written Opinion in Application No. PCT/US2017/053919 dated Jun. 26, 2018 13 pages.

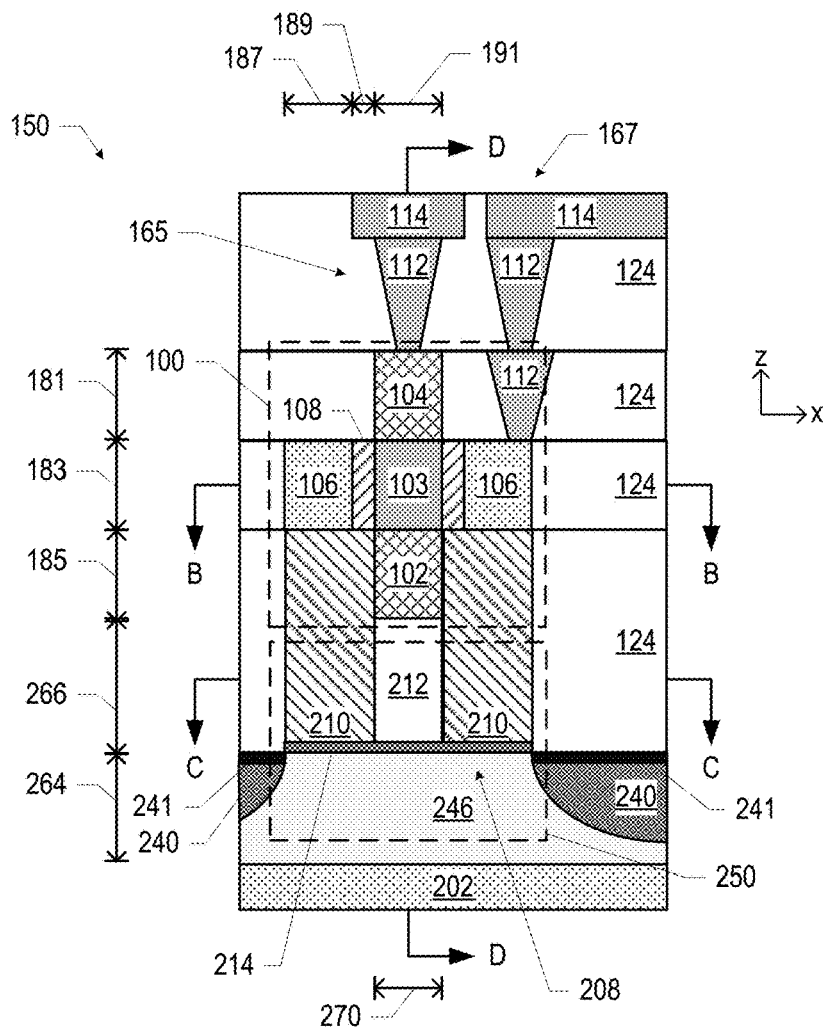
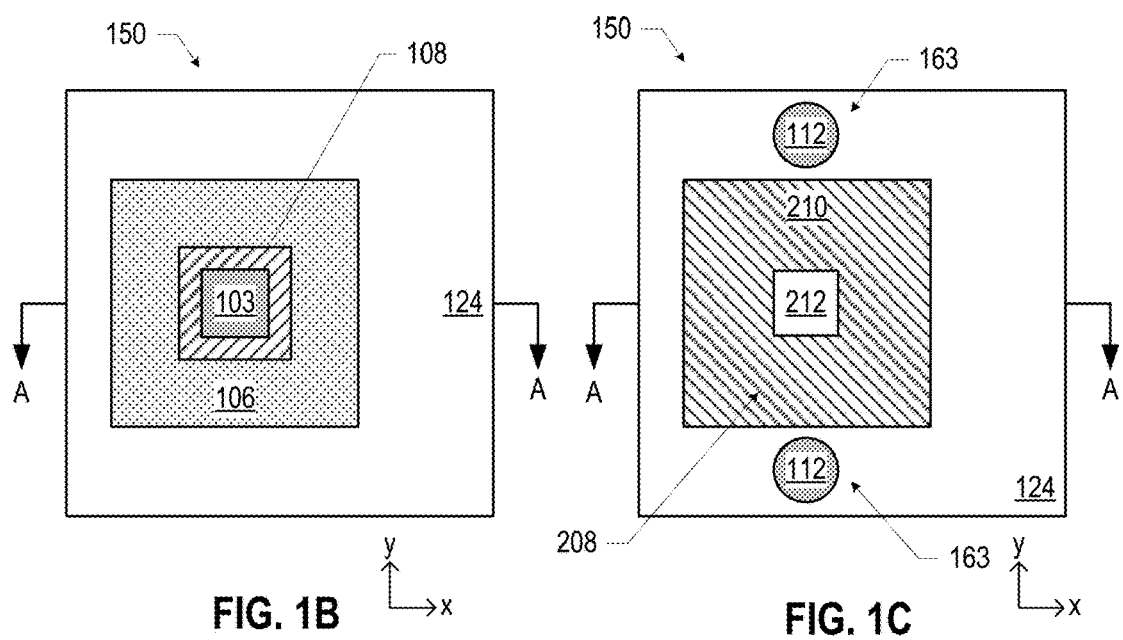
FIG. 1A
FIG. 1B   FIG. 1C

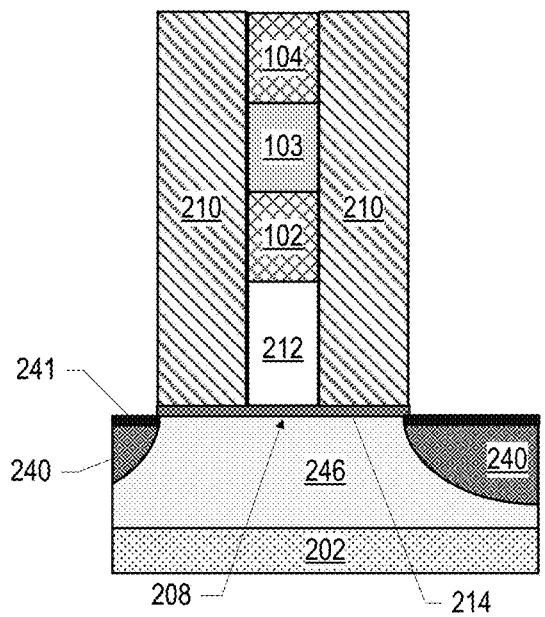
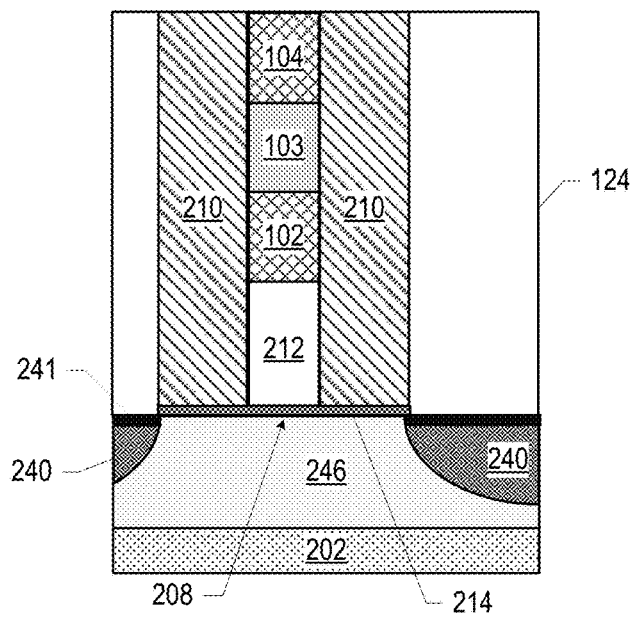
FIG. 2H  FIG. 2I
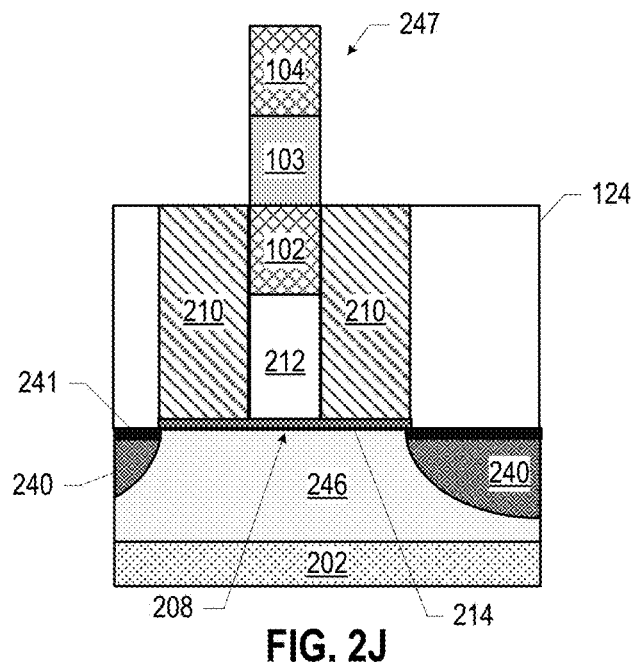
FIG. 2J

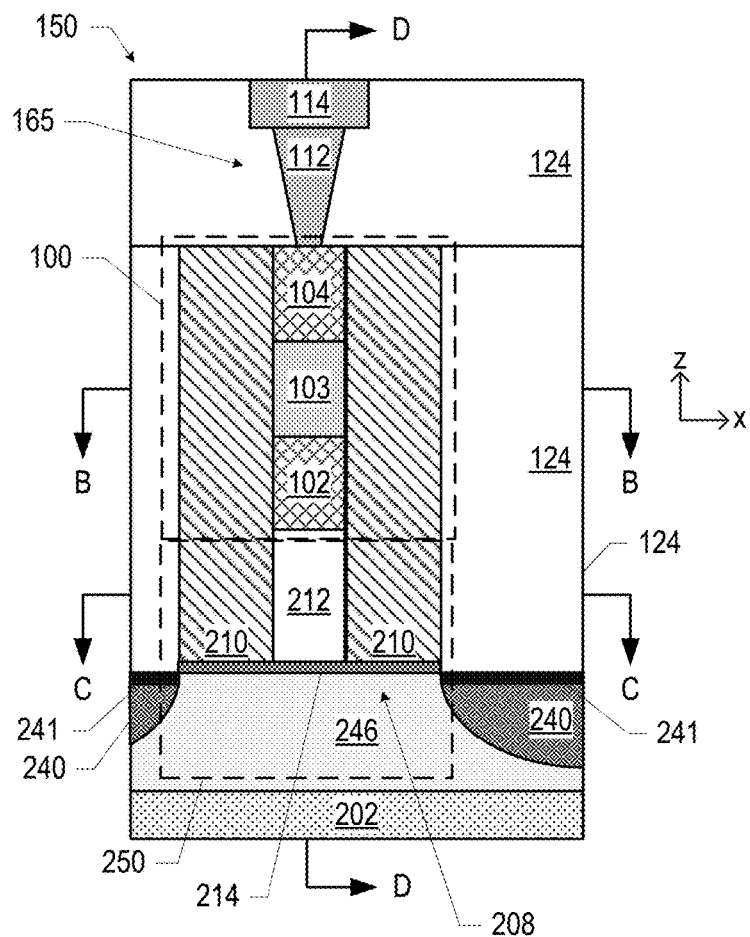
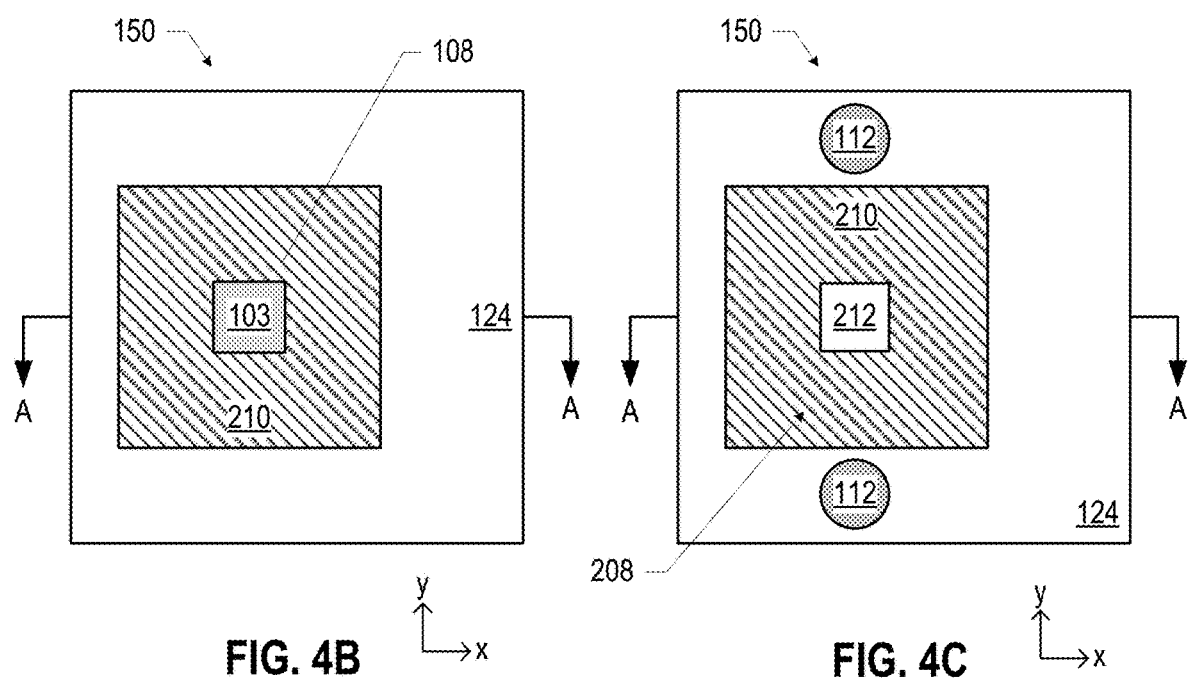
FIG. 4A
FIG. 4B
FIG. 4C

QUANTUM DOT DEVICES WITH SELECTORS

CROSS-REFERENCE TO RELATED APPLICATION

This application is a national stage application under 35 U.S.C. § 371 of PCT International Application Serial No. PCT/US2017/053919, filed on Sep. 28, 2017 and entitled "QUANTUM DOT DEVICES WITH SELECTORS," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1E are various views of an example quantum dot device including a quantum dot gate and a vertical selector, in accordance with various embodiments.

FIGS. 4A-4E are various views of another example quantum dot device including a quantum dot gate and a vertical selector, in accordance with various embodiments.

DETAILED DESCRIPTION

Figure 1D:
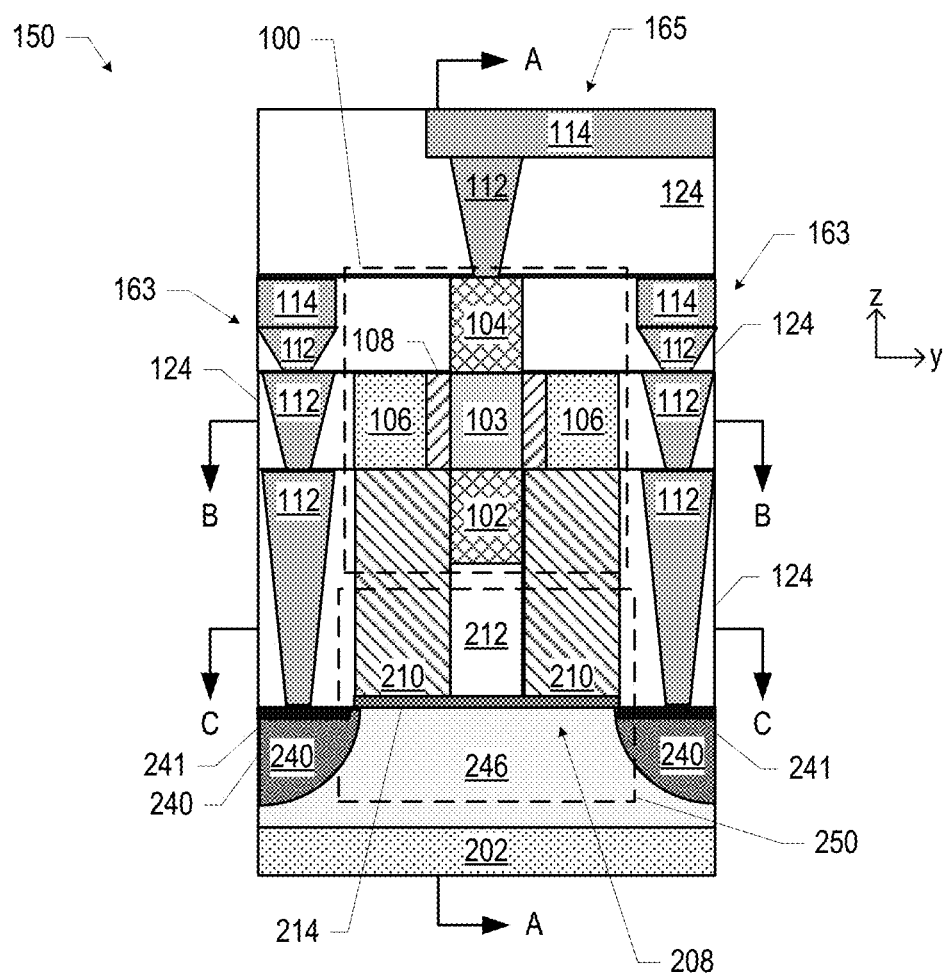

Disclosed herein are quantum dot devices and techniques. In some embodiments, a quantum processing device may include a quantum well stack, an array of quantum dot gate electrodes above the quantum well stack, and an associated array of selectors above the array of quantum dot gate electrodes. The array of quantum dot gate electrodes and the array of transistors may each be arranged in a grid.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified. As used herein, a "high-k dielectric" refers to a material having a higher dielectric constant than silicon oxide.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). For ease of discussion, all the lettered sub-figures associated with a particular numbered figure may be referred to by the number of that figure; for example, FIGS. 1A-1E may be referred to as "FIG. 1," FIGS. 2A-2P may be referred to as "FIG. 2," etc.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale.

Figure 1E:
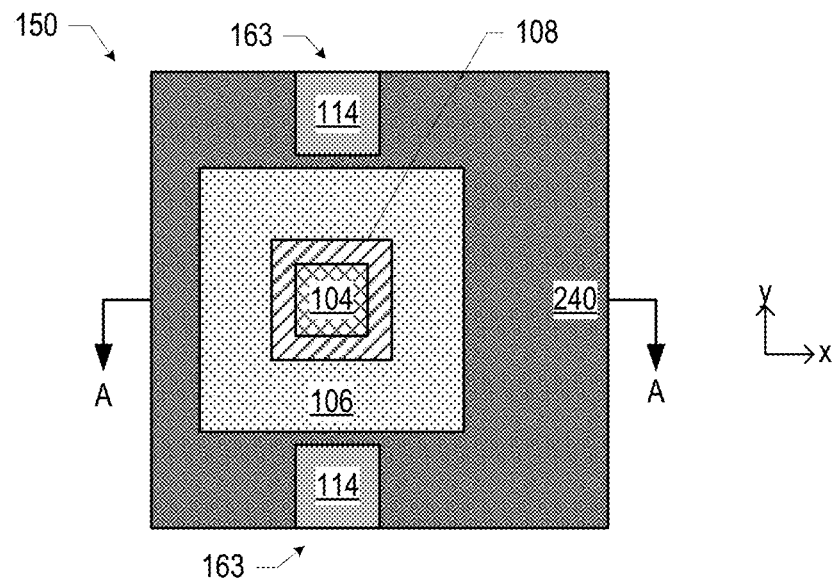

FIGS. 1A-1E are cross-sectional views of an example quantum dot device 150 including a vertical selector 100, in accordance with various embodiments. In particular, FIG. 1A is a "side" cross-sectional view (through the section A-A of FIGS. 1B-1E), FIG. 1B is a "top" cross-sectional view (through the section B-B of FIGS. 1A and 1D), FIG. 1C is a "top" cross-sectional view (through the section C-C of FIG. 1A), FIG. 1D is a "side" cross-sectional view (through the section D-D of FIG. 1A), and FIG. 1E is a "top" view with the conductive pathways 165 and 167 and the interface material 241 removed.

The vertical selector 100 of FIG. 1 may include a bottom contact 102, a top contact 104, and a selector material 103 disposed between the contacts 102 and 104. The vertical selector 100 may act as a bipolar switch, controlling the flow of current between the contacts 102 and 104. When the vertical selector 100 is in a conductive state, the "switch" may be closed and no or little current may flow; when the vertical selector 100 is in a non-conductive state, the "switch" may be open and significant current may flow. The state of the vertical selector 100 may change in response to the voltage applied across the contacts 102 and 104 of the vertical selector 100. In particular, the vertical selector 100 may be in a substantially non-conductive state when the voltage across the vertical selector 100 is between a negative threshold voltage Von− and a positive threshold voltage Von+. When the voltage across the vertical selector 100 reaches and exceeds the positive threshold voltage Von+, the vertical selector 100 may conduct current of a positive polarity; similarly, when the voltage across the vertical selector 100 reaches and drops below the negative threshold voltage Von−, the vertical selector 100 may conduct current of a negative polarity. The vertical selector 100 may thus act as a bipolar switch, controlling the flow of current in positive and negative directions in accordance with respective positive and negative thresholds.

A conductive pathway 165 to the contact 104 may route electrical signals to/from the contact 104. The conductive pathway 165 may include one or more conductive vias 112 and/or one or more conductive lines 114. The conductive lines 114 may be arranged to route electrical signals in a direction of a plane that is substantially parallel with a surface of the substrate 202 of the quantum dot device 150. For example, the conductive lines 114 may route electrical signals in a direction in and out of the page, or left and right in the page, from the perspective of FIG. 1A. The conductive vias 112 may be arranged to route electrical signals in a direction of a plane that is substantially perpendicular to the surface of the substrate 202 of the quantum dot device 150. The conductive vias 112 and lines 114 included in a quantum dot device 150 may include any suitable materials, such as copper, tungsten (deposited, e.g., by chemical vapor deposition (CVD)), or a superconductor (e.g., aluminum, tin, titanium nitride, niobium titanium nitride, tantalum, niobium, or other niobium compounds such as niobium tin and niobium germanium). Although the conductive pathway(s) 165 (and the conductive pathways 163 and 167, discussed below) are depicted in various ones of the accompanying figures as including a particular arrangement of conductive vias 112 and conductive lines 114, these arrangements are simply illustrative, and the conductive pathways 165 (and 163 and 167) may take any suitable form. For example, the conductive line 114 of the conductive pathway 165 may directly contact the contact 104, without an intervening conductive via 112. In some embodiments, the conductive pathway 165 may be a bit line, as discussed further below.

The contacts 102/104 may have any suitable material composition. In some embodiments, the contacts 102/104 may include tantalum, platinum, hafnium, cobalt, iridium, indium, conductive nitrides (e.g., titanium nitride or tantalum nitride), ruthenium, palladium, carbon, tungsten, or copper. In some embodiments, the contacts 102 and 104 may have the same material composition, while in other embodiments, the contacts 102 and 104 may have different material compositions. In some embodiments, the contact 102 may have the same material composition as the quantum dot gate electrode 212 (discussed further below); in some such embodiments, the quantum dot gate electrode 212 may provide the contact 102. In other embodiments, the contact 102 may have a different material composition than the quantum dot gate electrode 212. In some embodiments, the contact 104 may have the same material composition as the conductive via 112 (or other interconnect structure) that contacts the contact 104 in the conductive pathway 165; in some such embodiments, the conductive via 112 (or other interconnect structure) may provide the contact 104. In other embodiments, the contact 104 may have a different material composition than the conductive via 112 (or other interconnect structure) that contacts the contact 104 in the conductive pathway 165.

Any suitable material may provide the selector material 103 of the vertical selectors 100 disclosed herein. For example, in some embodiments, the selector material 103 may be an oxide material (e.g., niobium oxide) that may be capable of undergoing an insulator-to-metal transition in response to an applied voltage or resistance. In some embodiments, the selector material 103 may include vanadium oxide. In some embodiments, the selector material 103 may be a non-oxide material, such as a chalcogenide material, a multi-component material including group IV or group VI elements, such as silicon or tellurium (e.g., germanium tellurium, or germanium silicon tellurium). In some embodiments, the selector material 103 may be an oxide or chalcogenide material with at least one of the contacts 102/104 fabricated from a material with high solubility in the oxide or chalcogenide (such as copper, silver, or titanium). For example, at least one of the contacts 102/104 may include silver, and the selector material 103 may include hafnium oxide, aluminum oxide, or titanium oxide. In another example, at least one of the contacts 102/104 may include copper, and the selector material 103 may include hafnium oxide or titanium oxide. In another example, at least one of the contacts 102/104 may include titanium, and the selector material 103 may include hafnium oxide or titanium oxide. In some embodiments, the selector material 103 may be a phase change material; in some such embodiments, the selector material 103 may include a chalcogenide or other phase change memory material. In some embodiments, the selector material 103 may be an ovonic material, such as a ternary chalcogenide system (e.g., germanium silicon tellurium).

In some embodiments, the selector material 103 may be a metal filament material; in some such embodiments, the selector material 103 may include a solid electrolyte, one of the contacts 102/104 may be an electrochemically active metal (e.g., silver or copper), and the other of the contacts 102/104 may be an inert metal, as known in the art. A chemical barrier layer (e.g., nickel, tantalum, tantalum nitride, or tungsten) may be disposed between the electrochemically active metal electrode and the solid electrolyte to mitigate diffusion of the electrochemically active metal into the solid electrolyte, in some such embodiments.

In some embodiments, the selector material 103 may be formed of a thin film material. Some such materials may be deposited at relatively low temperatures, which makes them depositable within the thermal budgets imposed on back-end fabrication to avoid damaging the front-end components. In some embodiments, the selector material 103 may be formed of an amorphous, polycrystalline, or crystalline semiconductor, or an amorphous, polycrystalline, or crystalline semiconducting oxide. In some embodiments, the selector material 103 may be formed of an amorphous, polycrystalline, or crystalline group III-V material; amorphous, polycrystalline, or crystalline silicon; amorphous, polycrystalline, or crystalline germanium; amorphous, polycrystalline, or crystalline silicon germanium; amorphous, polycrystalline, or crystalline gallium arsenide; amorphous, polycrystalline, or crystalline indium antimonide; amorphous, polycrystalline, or crystalline indium gallium arsenide; amorphous, polycrystalline, or crystalline gallium antimonide; amorphous, polycrystalline, or crystalline tin oxide; amorphous, polycrystalline, or crystalline indium gallium oxide (IGO); or amorphous, polycrystalline, or crystalline indium gallium zinc oxide (IGZO).

The selector material 103 may include multiple material layers, as suitable and as known in the art. In some embodiments, the selector 100 may include barrier layer(s) providing a diffusion barrier between the contacts 102/104 and the selector material 103.

In some embodiments, a gate dielectric 108 may laterally surround the selector material 103, and a gate electrode 106 may laterally surround the gate dielectric 108 such that the gate dielectric 108 is disposed between the gate electrode 106 and the selector material 103; in other embodiments, the vertical selector 100 may not include a gate dielectric 108 or a gate electrode 106. When present, the gate electrode 106 may influence the electromagnetic fields in the selector material 103, changing the positive and negative thresholds discussed above and/or changing other operational parameters of the vertical selector 100. Thus, electrical signals provided to the gate electrode 106 may be used to "tune" the behavior of the vertical selector 100. A conductive pathway 167 to the gate electrode 106 may route electrical signals to/from the gate electrode 106.

The materials of the gate dielectric 108 and the gate electrode 106 may take any suitable form. For example, the gate electrode 106 may include at least one p-type work function metal or n-type work function metal, such as ruthenium, palladium, platinum, cobalt, nickel, conductive metal oxides (e.g., ruthenium oxide), hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 106 of the vertical selector 100 may consist of a stack of two or more metal layers, where one or more metal layers are work function metal layers and at least one metal layer is a fill metal layer. Further metal layers may be included for other purposes, such as to act as a barrier layer.

The gate dielectric 108 of the vertical selector 100 may be, for example, silicon oxide, aluminum oxide, or a high-k dielectric, such as hafnium oxide. More generally, the gate dielectric 108 of the vertical selector 100 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 108 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 108 to improve the quality of the gate dielectric 108.

In FIG. 1, the contact 102 is in contact with a quantum dot gate electrode 212, conductively coupling the contact 102 and the quantum dot gate electrode 212. In some embodiments, the contact 102 may not be in direct contact with the quantum dot gate electrode 212, and may instead be in conductive contact with the quantum dot gate electrode 212 through another conductive pathway (e.g., including one or more conductive lines 114 and/or conductive vias 112).

An insulating material 124 may be disposed around the vertical selector 100 and the interconnect structures of FIG. 1, as shown. In some embodiments, some or all of the different layers in the quantum dot device 150 may include insulating materials 124 with different material compositions; in other embodiments, the composition of the insulating material 124 may be the same between different layers. The insulating material 124 may be a dielectric material, such as silicon oxide, silicon nitride, aluminum oxide, carbon-doped oxide, and/or silicon oxynitride. In some embodiments, the insulating material 124 may be any suitable interlayer dielectric (ILD) material.

The components of the vertical selectors 100 disclosed herein may have dimensions of any suitable values. For example, in some embodiments, the contact 102 may have a thickness 185 between 5 nanometers and 300 nanometers (e.g., 30 nanometers). In some embodiments, a thickness 183 of the selector material 103, the gate dielectric 108, and the gate electrode 106 may be approximately the same, and/or each may be between 1 nanometer and 100 nanometers (e.g., between 10 nanometers and 30 nanometers). In some embodiments, the contact 104 may have a thickness 181 between 5 nanometers and 300 nanometers (e.g., 50 nanometers). In some embodiments, the width 191 of the contact 102, the selector material 103, and the contact 104 may be approximately the same, and/or each may be between 10 nanometers and 15 nanometers. In some embodiments, the width 189 of the gate dielectric 108 may be between 1 nanometer and 10 nanometers. In some embodiments, the width 187 of the gate electrode 106 may be between 10 nanometers and 20 nanometers. In some embodiments, the total lateral width of the vertical selector 100 (i.e., the sum of the width 191, twice the width 189, and twice the width 187) may be between 20 nanometers and 100 nanometers (e.g., between 30 nanometers and 70 nanometers, or approximately 50 nanometers). In some embodiments, the width of the contacts 102 and 104 may be different from (e.g., larger than) the width of the selector material 103; in some such embodiments, the width of the contacts 102 and 104 may each be between 20 nanometers and 100 nanometers (e.g., between 30 nanometers and 70 nanometers, or approximately 50 nanometers), and/or may be less than the total lateral width of the vertical selector 100. In some embodiments including an array of vertical selectors 100 and an array of quantum dot gates 208 (e.g., as discussed below with reference to FIGS. 3, 5, 7, and 9), the pitch of the vertical selectors 100 may be equal to the pitch of the quantum dot gates 208.

As noted above, the contact 102 of the vertical selector 100 may be in conductive contact with a quantum dot gate electrode 212 of a quantum dot gate 208. In the embodiment illustrated in FIG. 1, the vertical selector 100 is shown as located in the "next" layer above the quantum dot gate 208, but this is simply illustrative; a vertical selector 100 and its associated quantum dot gate 208 may be spaced apart by any desired number and arrangement of interconnect structures (e.g., conductive vias 112 and/or lines 114). A quantum dot gate 208 and the portion of the quantum well stack 246 under the quantum dot gate 208 (including a quantum well layer 252, discussed below) may be referred to herein as a quantum dot structure 250.

The quantum dot device 150 may further include a substrate 202, a quantum well stack 246, and one or more quantum dot gates 208 above the quantum well stack 246. The quantum well stack 246 may include one or more quantum well layers; examples of quantum well stacks 246 and quantum well layers are discussed in detail below with reference to FIG. 6. A quantum well layer included in a quantum well stack 246 may be arranged normal to the z-direction, and may provide a layer in which a two-dimensional electron gas (2DEG) may form to enable the generation of a quantum dot during operation of the quantum dot device 150, as discussed in further detail below. A quantum well layer itself may provide a geometric constraint on the z-location of quantum dots in the quantum well stack 246. To control the x-location and the y-location of quantum dots, voltages may be applied to quantum dot gates 208 disposed above the quantum well stack 246 to adjust the energy profile along the quantum well stack 246 in the x-direction and the y-direction and thereby constrain the x-location and y-location of quantum dots within quantum wells (discussed in detail below with reference to the quantum dot gates 208).

Figure 7:
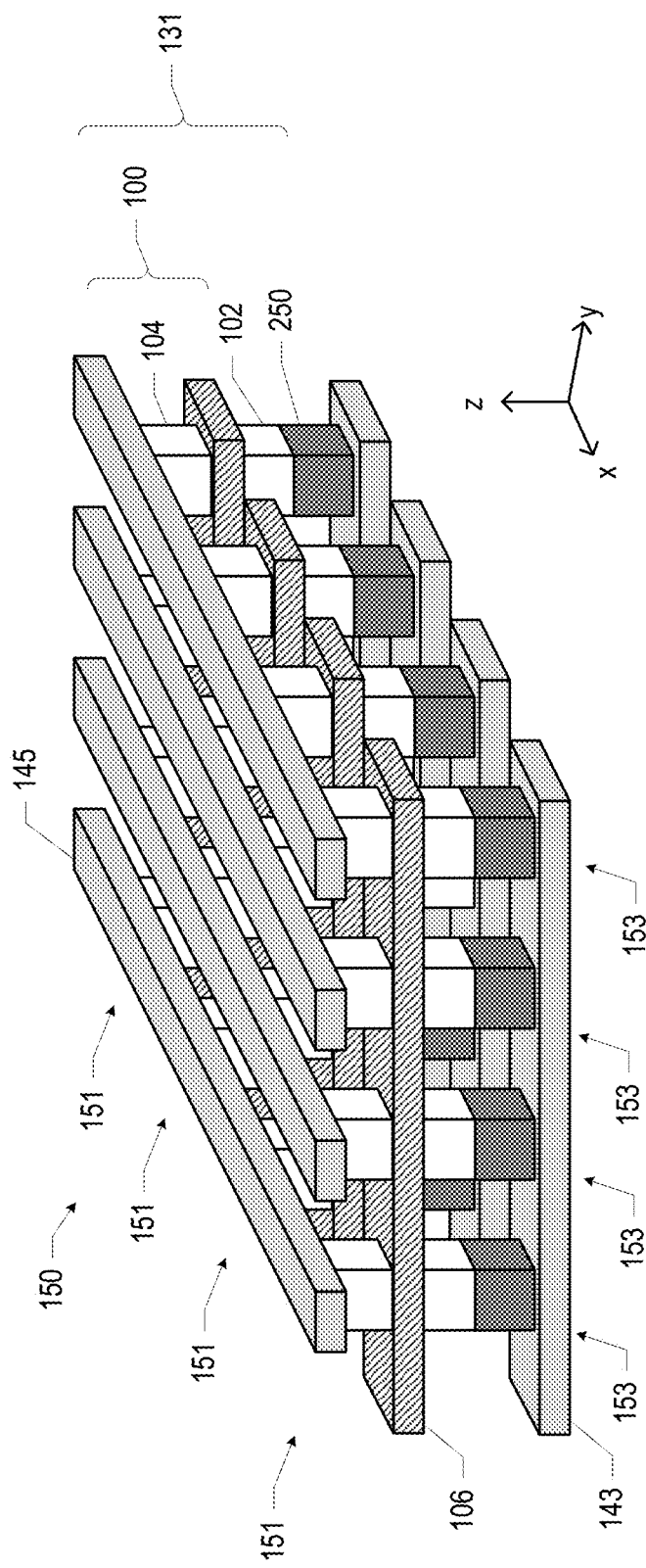
FIG. 7 is a perspective view of a portion of a quantum dot device including vertical selectors, in accordance with various embodiments.

One or more quantum dot gates 208 may be disposed above the quantum well stack 246. FIG. 1 illustrates a single quantum dot gate 208, while FIGS. 3, 5, and 7 illustrate quantum dot devices 150 including multiple quantum dot gates 208. The particular number of and arrangement of quantum dot gates 208 in the accompanying drawings is simply illustrative, and any suitable number and arrangement of gates may be used. For example, three or more quantum dot gates 208 may be arranged in any desired arrangement (e.g., as vertices of triangles or other polygons, in a rectangular or other array, in an irregular arrangement on the quantum well stack 246, etc.). In some embodiments, a quantum dot device 150 may include multiple quantum dot gates 208 that include at least one pair of quantum dot gates 208 spaced apart from each other in a first dimension (e.g., spaced apart from each other in the x-dimension), and at least one pair of quantum dot gates 208 spaced apart from each other in a second dimension perpendicular to the first dimension (e.g., spaced apart from each other in the y-dimension). A two-dimensional regular array of spaced-apart quantum dot gates 208 is one example of such an arrangement (e.g., as illustrated in FIGS. 3, 5, and 7), but many others exist (e.g., an irregular array or other distribution). These pairs may share a quantum dot gate 208; for example, three quantum dot gates 208 may satisfy this description if arranged accordingly.

In the embodiment illustrated in FIGS. 3, 5, and 7, different ones of the quantum dot gates 208 are spaced apart by intervening portions of the insulating material 210; in other embodiments, other materials or structures may be disposed between adjacent quantum dot gates 208. The insulating material 210 may have any suitable material composition. For example, in some embodiments, the insulating material 210 may include silicon oxide, silicon nitride, aluminum oxide, carbon-doped oxide, and/or silicon oxynitride. In some embodiments, the insulating material 210 may be a spacer material. The insulating material 210 may be patterned in any suitable way to define the location and shape of the quantum dot gates 208. In some embodiments (e.g., as illustrated in FIGS. 1 and 3), the insulating material 210 may extend up side faces of the contact 102; in further embodiments (e.g., as illustrated in FIG. 5), the insulating material 210 may extend up side faces of the contact 102, the selector material 103, and the contact 104.

Each of the quantum dot gates 208 may include a quantum dot gate dielectric 214. In some embodiments, the quantum dot gate dielectric 214 may be a substantially "flat" layer on the quantum well stack 246 (e.g., as illustrated in FIG. 1). In other embodiments, separate portions of the quantum dot gate dielectric 214 may be provided for each of the quantum dot gates 208 so that the quantum dot gate dielectric 214 extends at least partially up the side walls of the proximate insulating material 210 (not shown). In such embodiments, the quantum dot gate electrode 212 may extend between the portions of the associated quantum dot gate dielectric 214 on the side walls of the proximate insulating material 210, and thus may have a U-shape in cross section. In some embodiments, the quantum dot gate dielectric 214 may be a multilayer gate dielectric (e.g., with multiple materials used to improve the interface between the quantum well stack 246 and the quantum dot gate electrode 212). The quantum dot gate dielectric 214 may be, for example, silicon oxide, aluminum oxide, or a high-k dielectric, such as hafnium oxide. More generally, the quantum dot gate dielectric 214 may include elements such as hafnium, silicon, oxygen, titanium, tantalum, lanthanum, aluminum, zirconium, barium, strontium, yttrium, lead, scandium, niobium, and zinc. Examples of materials that may be used in the quantum dot gate dielectric 214 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the quantum dot gate dielectric 214 to improve the quality of the quantum dot gate dielectric 214. The quantum dot gate dielectric 214 may be a same material as the gate dielectric 108, or a different material.

Each of the quantum dot gates 208 may include a quantum dot gate electrode 212. The quantum dot gate dielectric 214 may be disposed between the quantum dot gate electrode 212 and the quantum well stack 246. In some embodiments, the quantum dot gate electrode 212 may be a superconductor, such as aluminum, tin, titanium nitride, niobium titanium nitride, tantalum, niobium, or other niobium compounds such as niobium tin and niobium germanium.

The quantum dot device 150 may include accumulation regions 240 that may serve as a reservoir of charge carriers for the quantum dot device 150. In some embodiments, the accumulation regions 240 may "surround" a footprint of the quantum dot gate(s) 208. In some embodiments, the accumulation regions 240 may be separated by a thin insulating barrier from the quantum well layer of the quantum well stack 246. For example, an n-type accumulation region 240 may supply electrons for electron-type quantum dots, and a p-type accumulation region 240 may supply holes for hole-type quantum dots. Conductive pathways 163 may make electrical contact with the accumulation region 240. In some embodiments, an interface material 241 may be disposed at a surface of an accumulation region 240. The interface material 241 may facilitate electrical coupling between the conductive pathway 163 (e.g., a conductive via 112 of the conductive pathway 163, as shown in FIG. 1) and the accumulation region 240. The interface material 241 may be any suitable metal-semiconductor ohmic contact material; for example, in embodiments in which the accumulation region 240 includes silicon, the interface material 241 may include nickel silicide, aluminum silicide, titanium silicide, molybdenum silicide, cobalt silicide, tungsten silicide, or platinum silicide. In some embodiments, the interface material 241 may be a non-silicide compound, such as titanium nitride. In some embodiments, the interface material 241 may be a metal (e.g., aluminum, tungsten, or indium).

In some embodiments, conductive pathways 163 may contact the interface material 241 at locations on opposite sides of the quantum dot gate 208 (e.g., as illustrated in FIGS. 1C-1E). The pathways through the quantum well stack 246 between the conductive pathways 163 may act as word lines in conjunction with the bit lines provided by the conductive pathways 165, as discussed further below. Control of the electrical signals along the word and bit lines may allow for individual "addressing" and control of different ones of the quantum dot gates 208, and therefore control of the quantum dots that form under the quantum dot gates 208 in the quantum well stack 246. Thus, a quantum dot structure 250 may be electrically coupled between the associated conductive pathways 163 and the contact 102 of the associated vertical selector 100.

The dimensions of the quantum well stack 246, the insulating material 210, and the quantum dot gates 208 may take any suitable values. For example, in some embodiments, the z-height 266 of the insulating material 210 and the quantum dot gate electrode 212 may be between 40 nanometers and 75 nanometers (e.g., approximately 50 nanometers). In some embodiments, the distance 268 between adjacent quantum dot gates 208 (see, e.g., FIG. 3) may be less than 150 nanometers (e.g., between 20 nanometers and 150 nanometers, between 20 nanometers and 40 nanometers, approximately 30 nanometers, or approximately 50 nanometers). In some embodiments, the length 270 of the quantum dot gates 208 may be between 40 nanometers and 60 nanometers (e.g., 50 nanometers). In some embodiments, the z-height 264 of the quantum well stack 246 may be between 200 nanometers and 400 nanometers (e.g., between 250 nanometers and 350 nanometers, or approximately 300 nanometers).

During operation of the quantum dot device 150, voltages may be applied to the quantum dot gate 208, under the control of the vertical selector 100 as a function of the voltage provided to the contact 104 via the conductive pathway 165 and the voltage provided to the accumulation region 240 via the conductive pathways 163 (and, when the gate electrode 106 are present, the voltage provided to the gate electrode 106 via the conductive pathway 167). The voltage applied to the quantum dot gate 208 may adjust the potential energy in the quantum well layer(s) in the quantum well stack 246 to create quantum wells of varying depths in which quantum dots may form. The portions of insulating material 210 disposed between adjacent quantum dot gates 208 may themselves provide "passive" barriers between quantum wells under the quantum dot gates 208 in the quantum well stack 246, and the voltages applied to different ones of the quantum dot gates 208 may adjust the potential energy under the quantum dot gates 208 in the quantum well stack 246; decreasing the potential energy may form quantum wells, while increasing the potential energy may form quantum barriers.

The quantum dot devices 150 disclosed herein may be used to form electron-type or hole-type quantum dots. Note that the polarity of the voltages applied to the quantum dot gates 208 (mediated by the vertical selectors 100) to form quantum wells/barriers depend on the charge carriers used in the quantum dot device 150. In embodiments in which the charge carriers are electrons (and thus the quantum dots are electron-type quantum dots), amply negative voltages applied to a quantum dot gate 208 may increase the potential barrier under the quantum dot gate 208, and amply positive voltages applied to a quantum dot gate 208 may decrease the potential barrier under the quantum dot gate 208 (thereby forming a potential well in the quantum well layer(s) in which an electron-type quantum dot may form). In embodiments in which the charge carriers are holes (and thus the quantum dots are hole-type quantum dots), amply positive voltages applied to a quantum dot gate 208 may increase the potential barrier under the quantum dot gate 208, and amply negative voltages applied to a quantum dot gate 208 may decrease the potential barrier under the quantum dot gate 208 (thereby forming a potential well in the associated quantum well layer(s) in which a hole-type quantum dot may form).

Voltages may be applied to each of the quantum dot gates 208 separately (under the control of the associated vertical selector 100) to adjust the potential energy in the quantum well layer under the quantum dot gates 208, and thereby control the formation of quantum dots in the quantum well stack 246 under each of the quantum dot gates 208. Additionally, the relative potential energy profiles under different ones of the quantum dot gates 208 allow the quantum dot device 150 to tune the potential interaction between quantum dots under different quantum dot gates 208. For example, if two quantum dots (e.g., one quantum dot under a quantum dot gate 208 and another quantum dot under another quantum dot gate 208) are separated by only a short potential barrier, the two quantum dots may interact more strongly than if they were separated by a taller potential barrier. Since the depth of the potential wells/height of the potential barriers under each quantum dot gate 208 may be adjusted by adjusting the voltages on the respective quantum dot gates 208 and neighboring gates, the differences in potential between various quantum dot gates 208 may be adjusted, and thus the interaction tuned. In some applications, the quantum dot gates 208 may be used as plunger gates to enable the formation of quantum dots under the quantum dot gates 208.

During operation, a bias voltage may be applied to the accumulation regions 240 (e.g., via the conductive pathways 163 and the interface material 241) to cause current to flow through the accumulation regions 240. When the accumulation regions 240 are doped with an n-type material, this voltage may be positive; when the accumulation regions 240 are doped with a p-type material, this voltage may be negative. The magnitude of this bias voltage may take any suitable value (e.g., between 0.25 volts and 2 volts). In some embodiments, the bias voltage applied to an accumulation region 240 may not be regulated by a vertical selector 100.

Figure 2A:
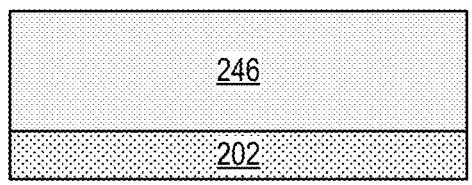
FIGS. 2A-2P illustrate various example stages in the manufacture of the quantum dot device of FIG. 1, in accordance with various embodiments.

The quantum dot devices 150 disclosed herein may be formed using any suitable technique. For example, FIGS. 2A-2P illustrate various example stages in the manufacture of the quantum dot device 150 of FIG. 1, in accordance with various embodiments. The drawings of FIGS. 2A-2F and 2H-2P share the perspective of FIG. 1A.

FIG. 2A illustrates a cross-sectional view of an assembly including a substrate 202 and a quantum well stack 246 on the substrate 202. The substrate 202 may include any suitable semiconductor material or materials, or any other suitable structure on which to perform the subsequent operations. In some embodiments, the substrate 202 may include a semiconductor material. For example, the substrate 202 may be a silicon wafer, a germanium wafer, a wafer including a group III-V material, etc. The quantum well stack 246 may include at least one quantum well layer. As discussed above, a 2DEG may form in the quantum well layer during operation of the quantum dot device 150. Various embodiments of the quantum well stack 246 are discussed below with reference to FIG. 6.

Figure 2B:
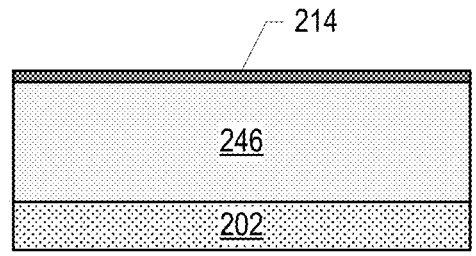

FIG. 2B is a cross-sectional view of an assembly subsequent to providing a quantum dot gate dielectric 214 on the assembly of FIG. 2A. In some embodiments, the quantum dot gate dielectric 214 may be formed by atomic layer deposition (ALD).

Figure 2C:
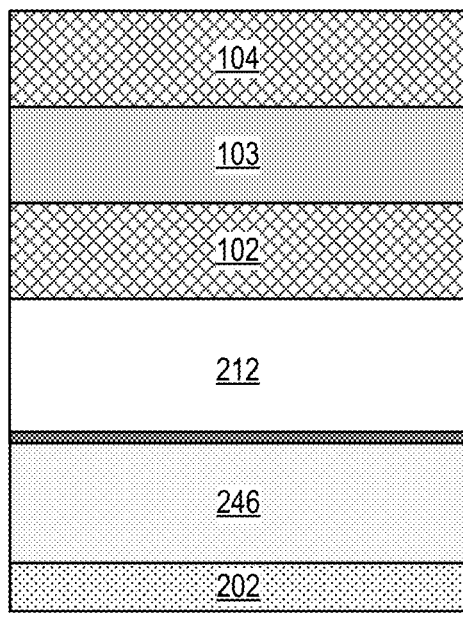

FIG. 2C is a cross-sectional view of an assembly subsequent to providing material for the quantum dot gate electrode 212, material for the contact 102, material for the selector material 103, and material for the contact 104, on the assembly of FIG. 2B. These materials may be provided using any suitable technique (e.g., ALD, CVD, or physical vapor deposition (PVD). In embodiments in which the contacts 102 and 104 include a dopant, a material may be initially deposited and then doped with the dopant using any suitable technique. As noted above, in some embodiments, the material for the selector material 103 may be deposited using a thin film deposition technique (e.g., sputtering, evaporation, molecular beam epitaxy (MBE), CVD, or ALD).

Figure 2D:
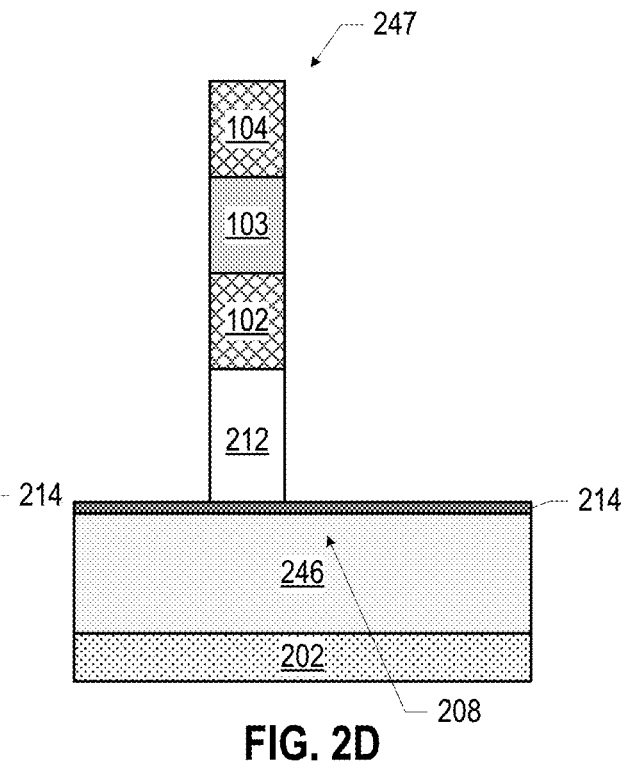

FIG. 2D is a cross-sectional view of an assembly subsequent to patterning the material stack of FIG. 2C into a pillar 247 (or an array of multiple pillars 247 when forming the quantum dot devices of FIGS. 3 and 5). As used herein, "patterning" may refer to forming a pattern in one or more materials using any suitable techniques (e.g., applying a resist, patterning the resist using lithography, and then etching the one or more material using dry etching, wet etching, or any appropriate technique). In some embodiments, the formation of the pillar 247 may be performed in a single set of etch operations, while in other embodiments, the pillar 247 may be formed by etching a ridge into the assembly of FIG. 2C (e.g., ridges that extend in and out of the plane of the drawing), then performing another set of etch operations to form the ridge into a pillar 247 (e.g., by etching trenches in planes parallel to the plane of the drawing). As discussed below, multiple pillars 247 may be formed using such techniques, although only a single pillar 247 is shown in FIG. 2D for clarity of illustration. In some embodiments, a photobucket technique may be used to form the pillar(s) 247.

Figure 2E:
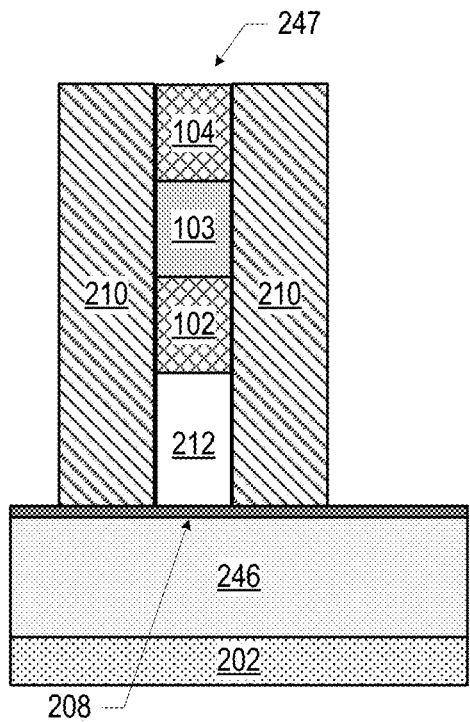

FIG. 2E is a cross-sectional view of an assembly subsequent to providing an insulating material 210 around the pillar 247 of the assembly of FIG. 2D. The insulating material 210 may take the form of a "spacer" present on side faces of the pillar 247. For example, the insulating material 210 may be conformally deposited (e.g., using ALD) on the assembly of FIG. 2D, and then etched "downward" to remove the insulating material 210 on the "horizontal" surfaces (e.g., on the top of the pillar 247 and on most of the exposed quantum dot gate dielectric 214).

Figure 2F:
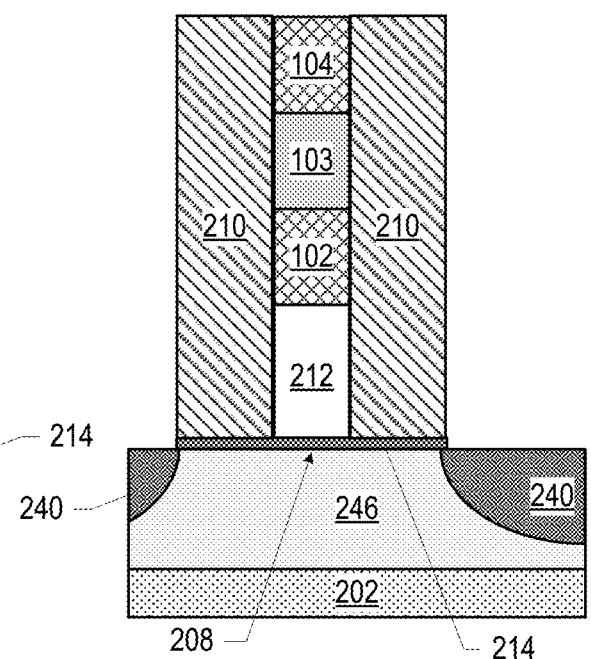
Figure 2G:
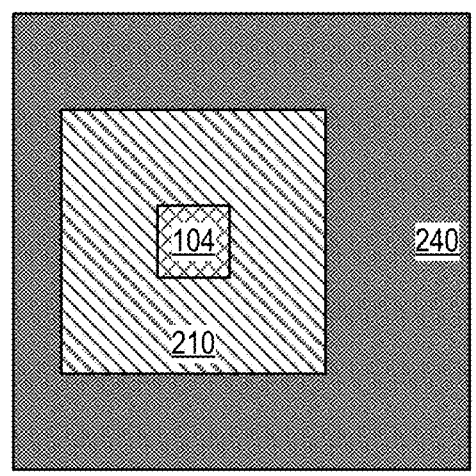

FIG. 2F is a cross-sectional view of an assembly subsequent to removing the exposed quantum dot gate dielectric 214, and doping the quantum well stack 246 of the assembly of FIG. 2G to form accumulation regions 240 in the quantum well stack 246 adjacent to the insulating material 210. FIG. 2G is a top view of the assembly of FIG. 2F. The accumulation regions 240 may be in conductive contact with one or more quantum well layers (discussed below). In some embodiments, the accumulation regions 240 may be a single accumulation region 240 that extends around a periphery of the quantum dot device 150 (e.g., around an array of quantum dot gates 208, as illustrated in FIGS. 3, 5, and 7). The type of dopant used to form the accumulation regions 240 may depend on the type of quantum dot desired, as discussed above. In some embodiments, the doping may be performed by ion implantation. For example, when a quantum dot is to be an electron-type quantum dot, the accumulation regions 240 may be formed by ion implantation of phosphorous, arsenic, or another n-type material. When a quantum dot is to be a hole-type quantum dot, the accumulation regions 240 may be formed by ion implantation of boron or another p-type material. An annealing process that activates the dopants and causes them to diffuse farther into the quantum well stack 246 may follow the ion implantation process. The depth of the accumulation regions 240 may take any suitable value; for example, in some embodiments, the accumulation regions 240 may each have a depth between 500 Angstroms and 1000 Angstroms. The outer portions of the insulating material 210 may provide a doping boundary, limiting diffusion of the dopant from the accumulation regions 240 into the area under the quantum dot gate 208. In some embodiments, the accumulation regions 240 may extend under the adjacent insulating material 210. In some embodiments, the accumulation regions 240 may extend past the adjacent insulating material 210, or may terminate under the adjacent insulating material 210 and not reach the boundary between the adjacent insulating material 210 and the proximate quantum dot gate electrode 212. The doping concentration of the accumulation regions 240 may, in some embodiments, be between $10^{17}/cm^3$ and $10^{20}/cm^3$.

FIG. H is a cross-sectional side view of an assembly subsequent to providing a layer of nickel or other material over the assembly of FIG. 2I, performing an anneal to cause the material to interact with the accumulation regions 240 to form the interface material 241, then removing the unreacted material. The nickel or other material may be deposited using any suitable technique (e.g., a plating technique, CVD, or ALD). When the accumulation regions 240 include silicon and the material includes nickel, for example, the interface material 241 may be nickel silicide. Materials other than nickel may be deposited in the operations discussed above with reference to FIG. 2H to form other interface materials 241, including titanium, aluminum, molybdenum, cobalt, tungsten, or platinum, for example.

FIG. 2I is a cross-sectional view of an assembly subsequent to providing an insulating material 124 on the assembly of FIG. 2H. The insulating material 124 may take any of the forms discussed above. For example, the insulating material 124 may be a dielectric material, such as silicon oxide. The insulating material 124 may be provided using any suitable technique, such as spin coating, CVD, or plasma-enhanced CVD (PECVD). In some embodiments, the insulating material 124 may be polished back after deposition, and before further processing. In some embodiments, conductive vias 112 of the conductive pathways 163 may be formed in the insulating material of the assembly of FIG. 2H (not visible from the perspective of FIG. 2I). Any suitable technique may be used to form conductive vias 112 and/or lines 114 (e.g., subtractive, additive, Damascene, dual Damascene, etc.).

FIG. 2J is a side cross-sectional view of an assembly subsequent to recessing the insulating material 124 of the assembly of FIG. 2I to expose the selector material 103 and the contact 104 of the pillar 247. Any suitable technique may be used to perform this recess, such as a suitable etch.

Figure 2K:
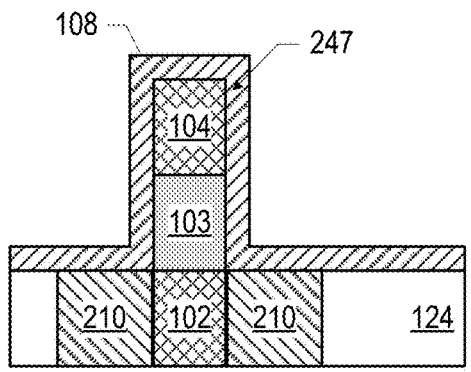

FIG. 2K is a side cross-sectional view of an assembly subsequent to conformally depositing material for the gate dielectric 108 on the assembly of FIG. 2J. FIGS. 2K-2P omit the layers of the assembly below and including the quantum dot gate 208 for ease of illustration. The material for the gate dielectric 108 may be deposited on the exposed portions of the pillar 247 (including the side faces of the selector material 103) and on the exposed surface of the insulating material 124. As noted elsewhere herein, the material for the gate dielectric 108 may take the form of any of the gate dielectric materials discussed herein. For example, the gate dielectric 108 may be a multilayer gate dielectric including multiple different materials. In some embodiments, the gate dielectric 108 may be deposited using ALD.

Figure 2L:
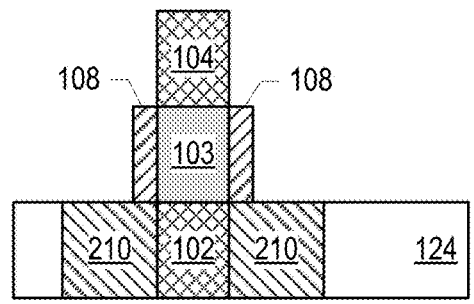

FIG. 2L is a side cross-sectional view of an assembly subsequent to performing a directional (or "anisotropic") etch on the material for the gate dielectric 108 in the assembly of FIG. 2K to remove some of the material for the gate dielectric 108 while leaving the gate dielectric 108 on the exposed side faces of the selector material 103. In this manner, the gate dielectric 108 may surround the selector material 103 in the assembly of FIG. 2L. In some embodiments, the directional etch may be a dry etch.

Figure 2M:
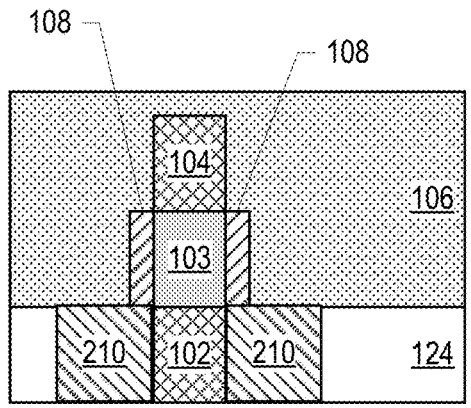

FIG. 2M is a side cross-sectional view of an assembly subsequent to depositing material for the gate electrode 106 on the assembly of FIG. 2L. Any suitable technique may be used to deposit the material for the gate electrode 106, such as sputtering, evaporation, ALD, or CVD techniques. As noted elsewhere herein, the material for the gate electrode 106 may take the form of any of the gate electrode materials discussed herein. In some embodiments, the material for the gate electrode 106 may initially be deposited to extend over the pillar 247, then the insulating material 124 may be polished back (e.g., using a chemical mechanical polishing (CMP) technique).

Figure 2N:
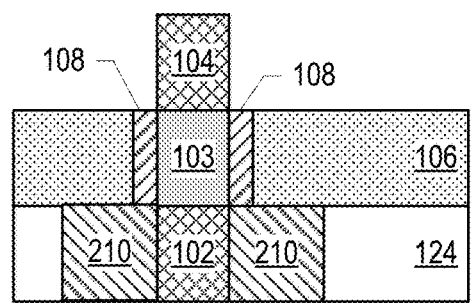

FIG. 2N is a side cross-sectional view of an assembly subsequent to recessing the material for the gate electrode 106 of the assembly of FIG. 2M. The material for the gate electrode 106 may be recessed back so that the material for the gate electrode 106 does not contact the contact 104, and so that the gate dielectric 108 may be disposed between the selector material 103 and the material for the gate electrode 106. Any suitable technique may be used to recess the material for the gate electrode 106 (e.g., a wet or dry recess).

Figure 2O:
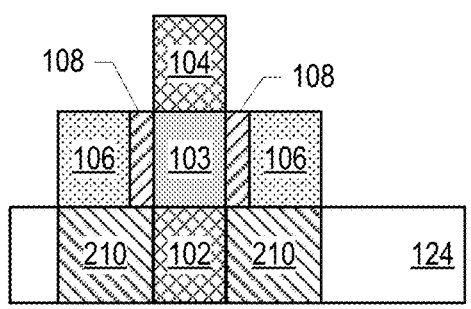
Figure 2P:
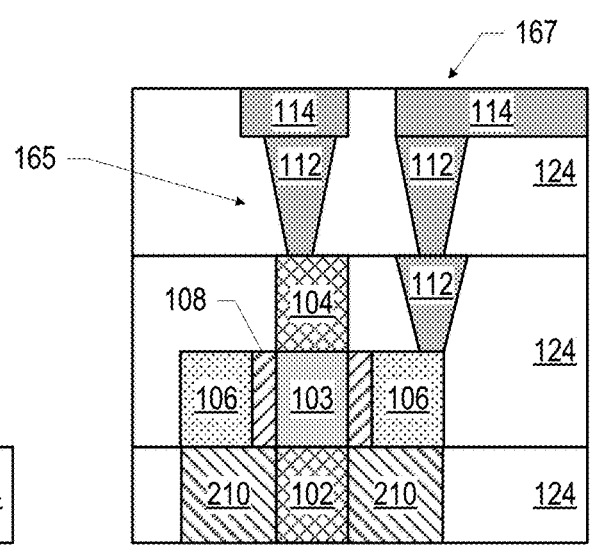

FIG. 2O is a side cross-sectional view of an assembly subsequent to patterning the material for the gate electrode 106 of the assembly of FIG. 2N to form the gate electrode 106. As illustrated in FIG. 2O (and FIG. 1B), the gate electrode 106 may laterally surround the gate dielectric 108. The patterning of the material for the gate electrode 106 may be performed using any suitable technique (e.g., using a photosensitive resist, exposing and developing the photosensitive resist, then etching away the unwanted material in accordance with the pattern in the resist). As discussed above with reference to the formation of the pillar 247, and as discussed below, the formation of the gate electrode 106 may involve one or multiple sets of etch operations. In some embodiments, the gate electrode 106 may be materially continuous between multiple vertical selectors 100, as discussed below.

FIG. 2P is a side cross-sectional view of an assembly subsequent to forming additional interconnect structures (e.g., conductive vias 112 and conductive lines 114 for the conductive pathways 163, 165, and 167) on the assembly of FIG. 2O. Insulating material 124 may be disposed around the additional interconnect structures in the assembly of FIG. 2P. Any suitable fabrication techniques may be used to form the additional interconnect structures in the assembly of FIG. 2P (e.g., subtractive, additive, Damascene, dual Damascene, etc.). Additionally, as noted above, the interconnect structures shown in FIG. 2P is simply illustrative, and any desired further fabrication operations may be performed on the assembly of FIG. 2P.

Figure 3A:
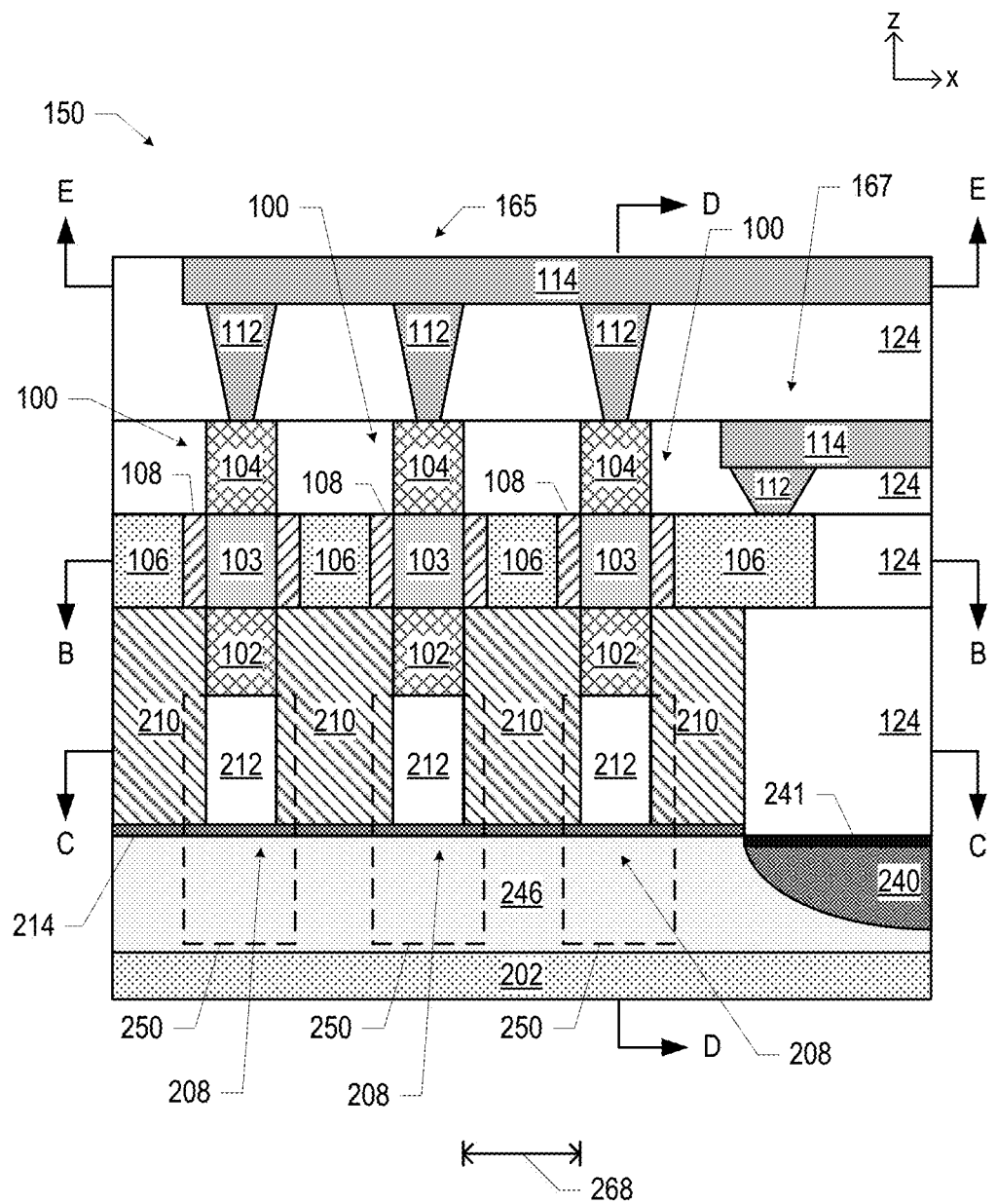
FIGS. 3A-3E are various views of an example quantum dot device including an array of quantum dot gates and an array of vertical selectors, in accordance with various embodiments.
Figure 3B:
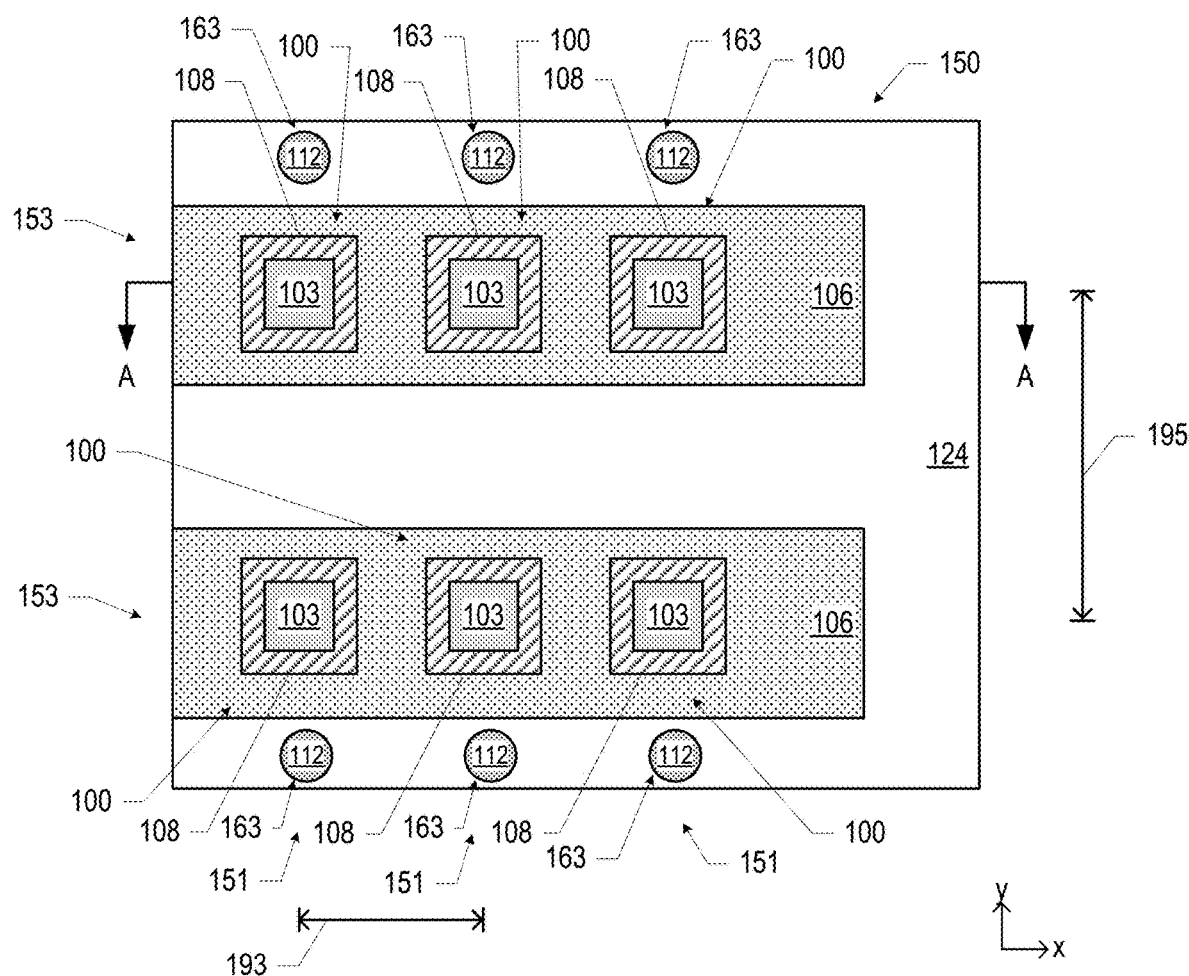
Figure 3C:
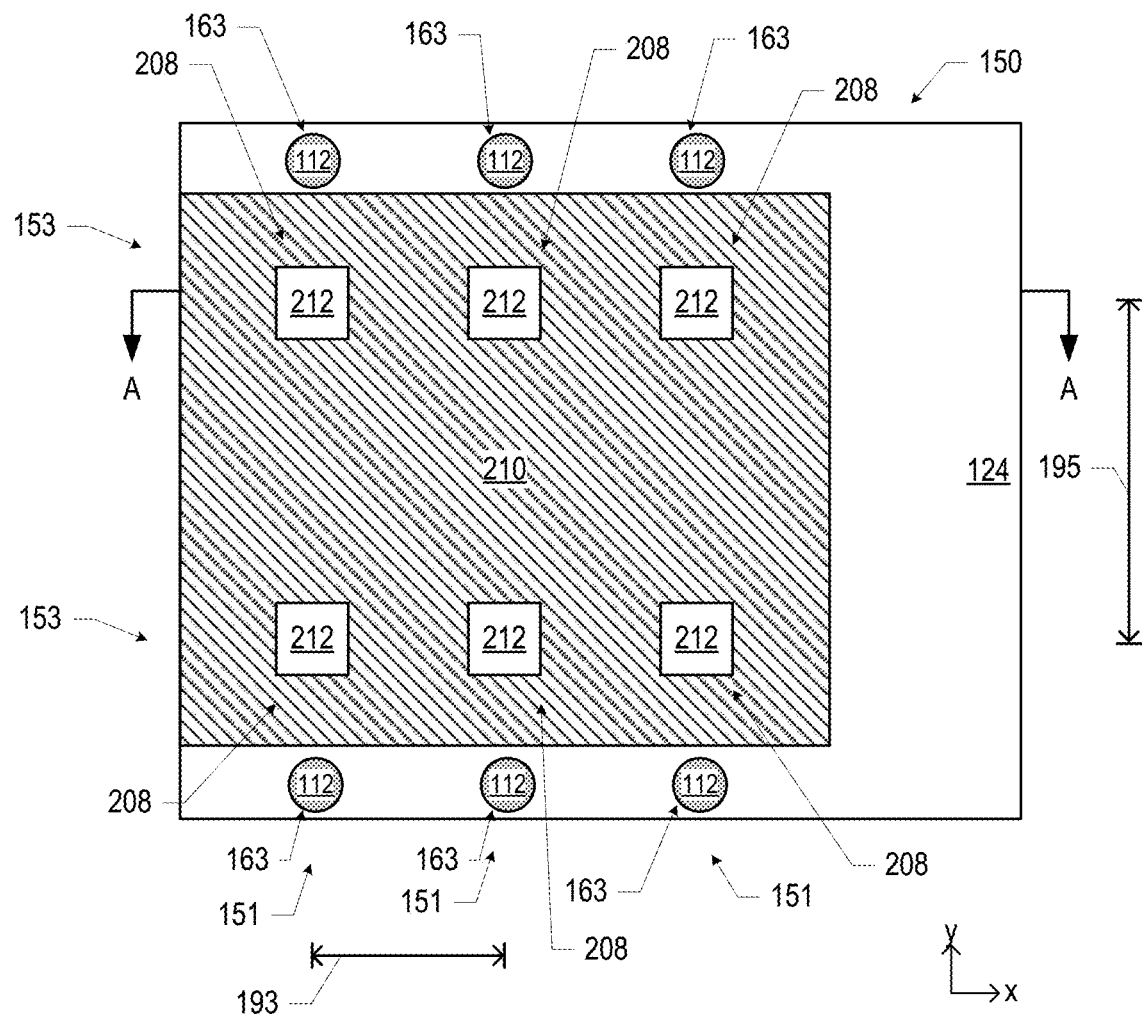
Figure 3D:
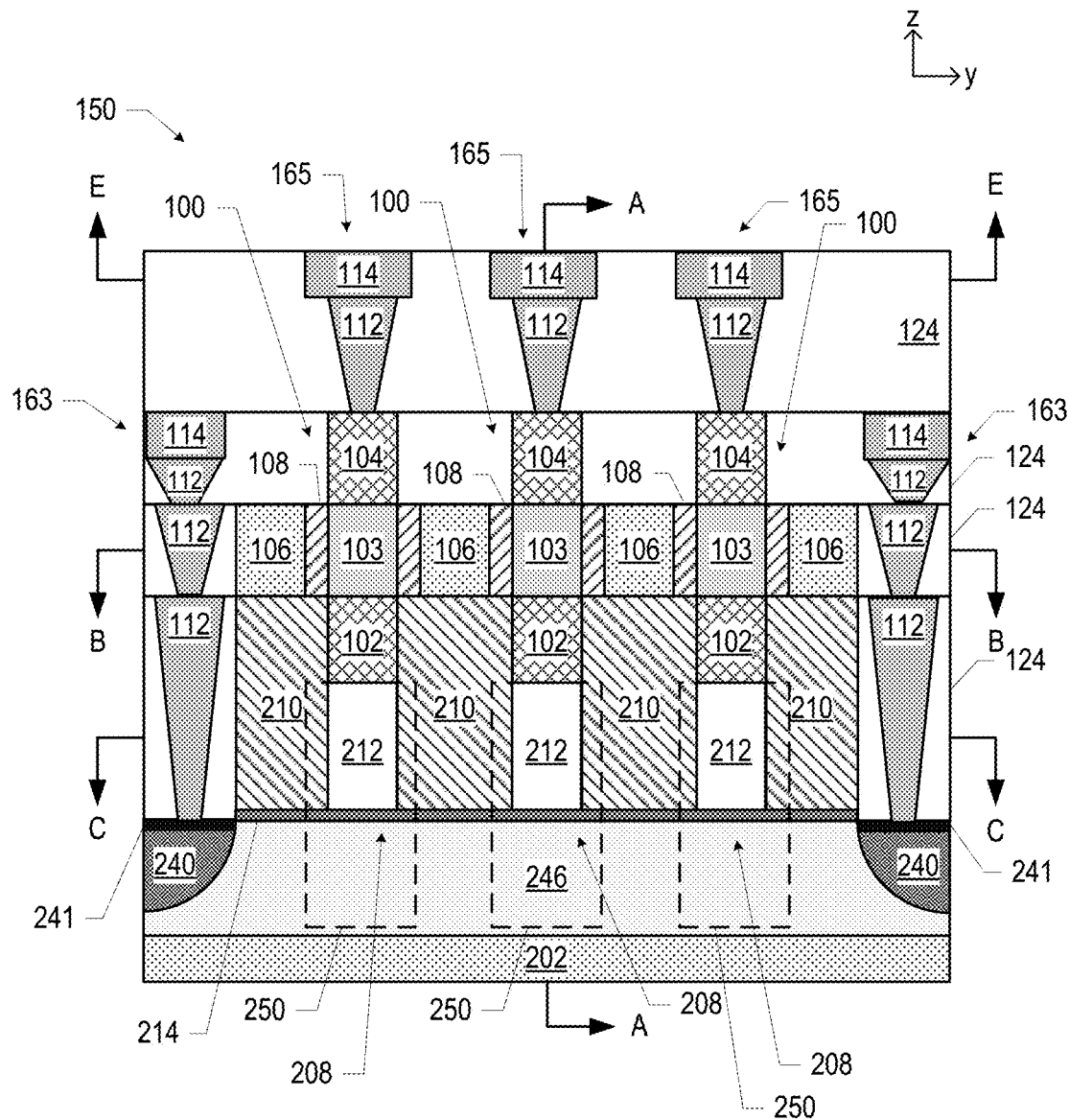
Figure 3E:
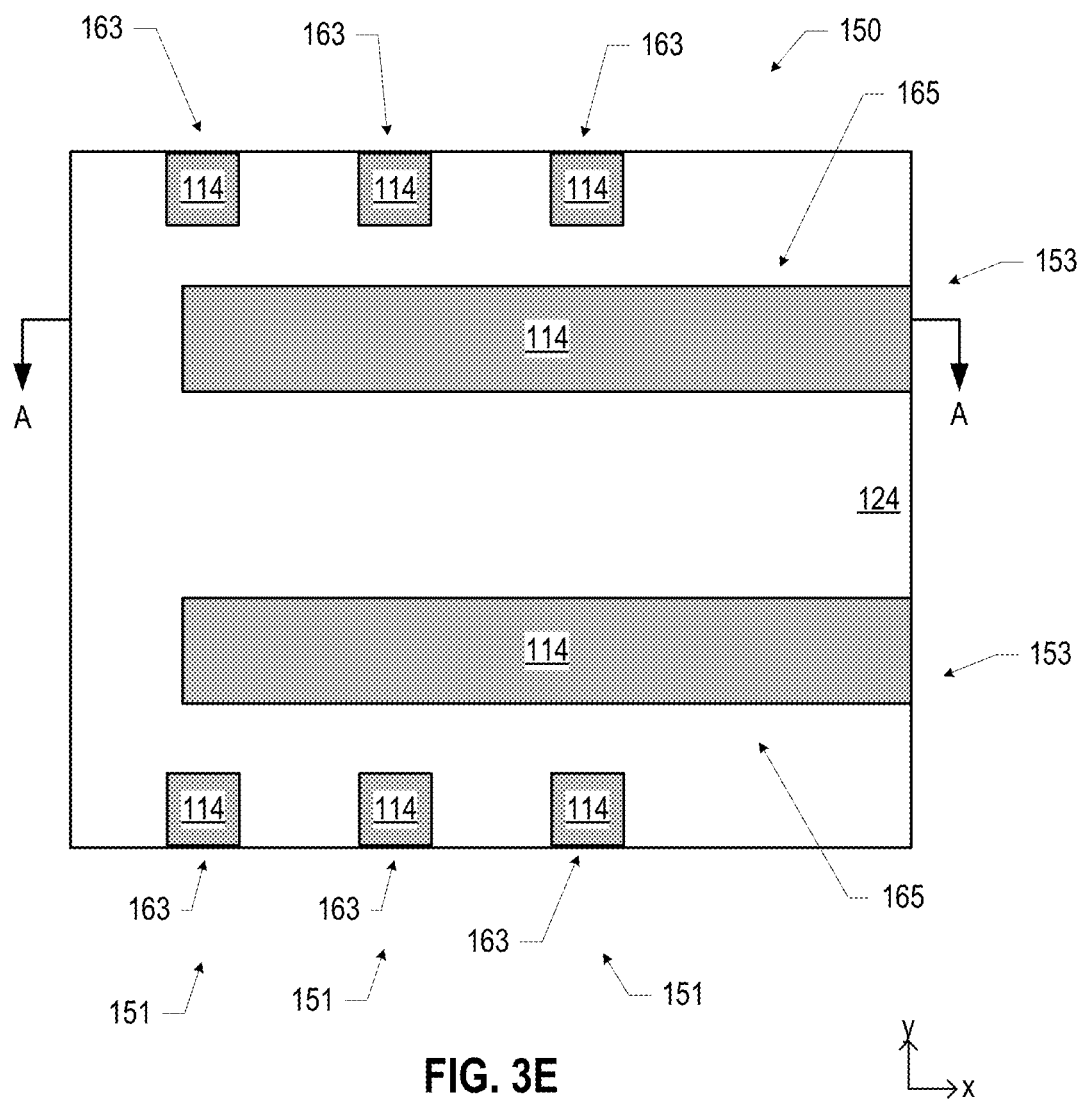

As noted above, in some embodiments, a quantum dot device 150 may include multiple vertical selectors 100 and multiple quantum dot gates 208. Some of these vertical selectors 100 may be fabricated simultaneously, and may be electrically coupled in any of a number of ways. For example, FIGS. 3A-3E are cross-sectional views of an example quantum dot device 150 including an array of vertical selectors 100 and an array of quantum dot gates 208, in accordance with various embodiments. In particular, FIG. 3A is a "side" cross-sectional view (through the section A-A of FIGS. 3B-3E), FIG. 3B is a "top" cross-sectional view (through the section B-B of FIGS. 3A and 3D), FIG. 3C is a "top" cross-sectional view (through the section C-C of FIG. 3A), FIG. 3D is a "side" cross-sectional view (through the section D-D of FIG. 3A), and FIG. 3E is a "top" cross-sectional view (through the section E-E of FIG. 3A). A number of the components of the quantum dot device 150 of FIG. 3 (and FIGS. 4-9) may take the form of any of the embodiments of those components discussed elsewhere herein, and thus these components are not discussed again with reference to FIG. 3 (or FIGS. 4-9) for clarity of illustration.

In the quantum dot device 150 of FIG. 3, multiple vertical selectors 100 and multiple quantum dot gates 208 may each be arranged in an array. The arrays of the quantum dot device 150 of FIG. 3 may be regular rectangular arrays (e.g., grids), but other arrays of multiple vertical selectors 100 and multiple quantum dot gates 208 may be used. For discussion purposes, the vertical selectors 100 and the quantum dot gates 208 of the quantum dot device 150 of FIG. 3 may be referred to as being arranged in columns 151 and rows 153; these labels are intended to enable a discussion of the relative placement and connections between different ones of the vertical selectors 100 and different ones of the quantum dot gates 208.

As illustrated in FIG. 3, the vertical selectors 100 in a particular row 153 may share a conductive pathway 165, electrically coupling the contacts 104 of the vertical selectors 100 in a particular row 153 so that all the contacts 104 in the row 153 have the same voltage at any given time. The voltages on the contacts 104 in different rows 153 may be independently controllable. In some embodiments, the conductive pathways 165 associated with different rows 153 may be different bit lines.

As illustrated in FIG. 3, each column 151 of quantum dot gates 208 may be "bookended" by a conductive pathway 163 that makes electrical contact with the accumulation region 240 at a location proximate to the "outermost" quantum dot gates 208 of the particular column 151. Thus, each column 151 of the quantum dot gates 208 may be associated with a pair of conductive pathways 163, and a particular pair of conductive pathways 163 may be shared by all of the quantum dot gates 208 in that column 151. As discussed above with reference to FIG. 1, the pair of conductive pathways 163 associated with a particular column 151 may be used to control the electric potential "under" the quantum dot gates 208 in that column 151; in some embodiments, the voltage in the quantum well stack 246 "under" the quantum dot gates 208 of a particular column 151 may be the same at any given time. The voltages in the quantum well stack 246 "under" quantum dot gates 208 of different columns 151 may be independently controllable. In some embodiments, the conductive pathways 163 associated with different columns 151 may be different word lines. Thus, the multiple quantum dot gates 208 are associated with multiple corresponding quantum dot structures 250, each of which is electrically coupled between the associated pair of conductive pathways 163 (corresponding to the column 151 of the quantum dot gate 208) and the contact 102 of the associated vertical selector 100 (in contact with the quantum dot gate 208).

As illustrated in FIG. 3, the vertical selectors 100 in a particular row 153 may share a gate electrode 106. In some embodiments, sharing a gate electrode 106 between multiple vertical selectors 100 may mean that the gate electrodes 106 of the multiple vertical selectors 100 are materially continuous. In some embodiments, the gate electrodes 106 of different ones of the vertical selectors 100 in a particular row 153 may have gate electrodes 106 that are not materially continuous, but that are electrically coupled so that all the gate electrodes 106 in the row 153 have the same voltage at any given time. The gate electrodes 106 in different rows 153 may not be materially continuous, as shown, and the voltages on the gate electrodes 106 in different rows 153 may be independently controllable. In other embodiments, the vertical selectors 100 in a particular column 151 may share a gate electrode 106, in addition to or instead of vertical selectors 100 in a particular row 153 sharing a gate electrode 106. For example, in the embodiment of FIG. 7 (discussed below), the vertical selectors 100 in a particular column 151 may share a gate electrode 106.

In the embodiment of FIG. 3, different ones of the quantum dot gates 208 may not be directly coupled to each other; in particular, no quantum dot gate electrodes 212 of different quantum dot gates 208 may be materially contiguous. This need not be the case, however, and in other embodiments, different ones of the quantum dot gates 208 may be electrically coupled in any desired manner.

The spacing between different ones of the vertical selectors 100 in an array may take any suitable values. For example, in some embodiments, the center-to-center spacing 193 between adjacent vertical selectors in a row 153 may be between 30 nanometers and 300 nanometers (e.g., 50 nanometers). In some embodiments, the center-to-center spacing 195 between adjacent vertical selectors in a column 151 may be between 30 nanometers and 300 nanometers (e.g., 50 nanometers). In some embodiments, the center-to-center spacing 193 and the center-to-center spacing 195 may be equal. The spacing of the vertical selectors 100 may be mirrored by the spacing of the quantum dot gates 208 associated with the vertical selectors 100 (e.g., the vertical selectors 100 and the quantum dot gates 208 may have the same pitch in multiple dimensions).

Any suitable technique may be used to manufacture the quantum dot device 150 of FIG. 3. For example, the techniques discussed above with reference to FIG. 2 may be used (e.g., multiple pillars 247 may be formed in the assembly of FIG. 2D, multiple gate electrodes 106 may be formed in the assembly of FIG. 2O, and multiple conductive pathways 163, 165, and 167 may be formed).

Figure 4D:
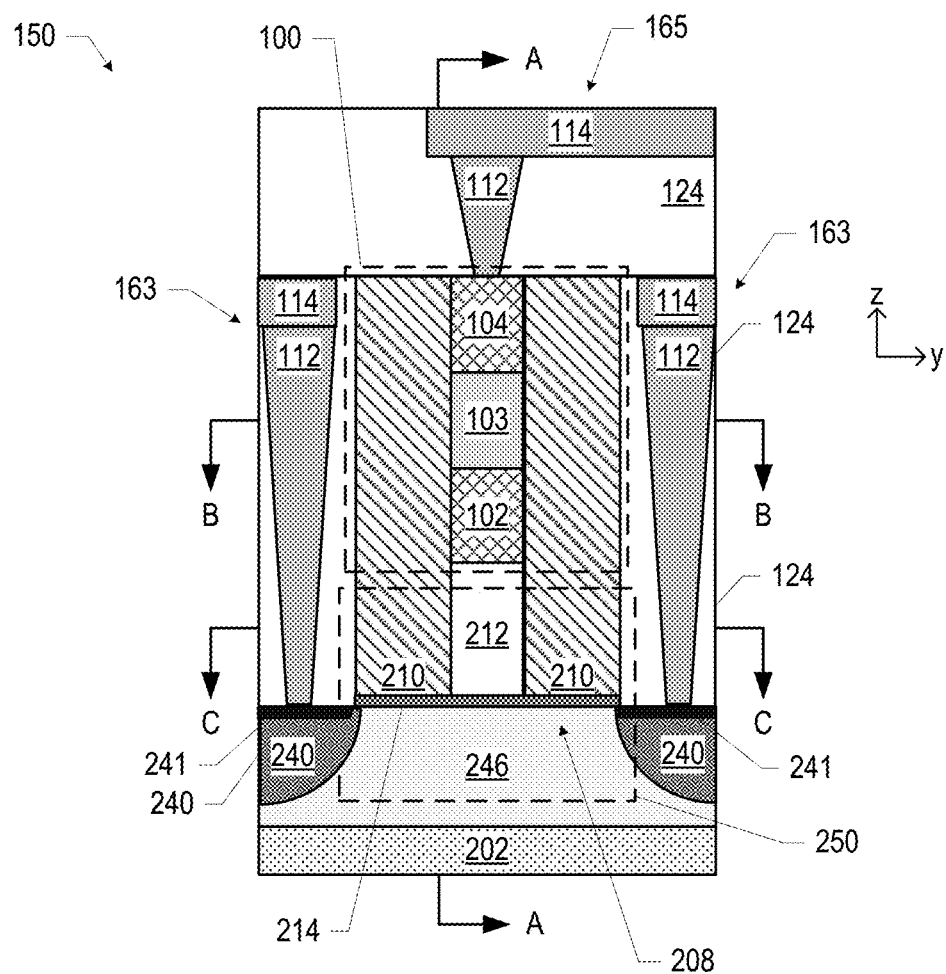
Figure 4E:
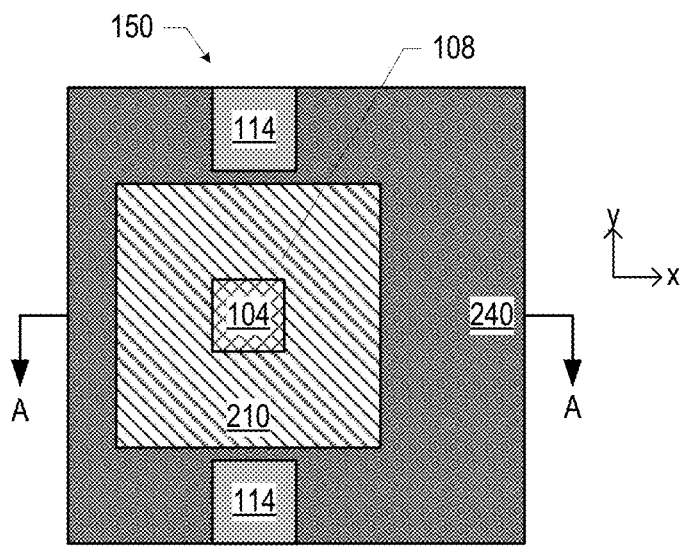
Figure 5A:
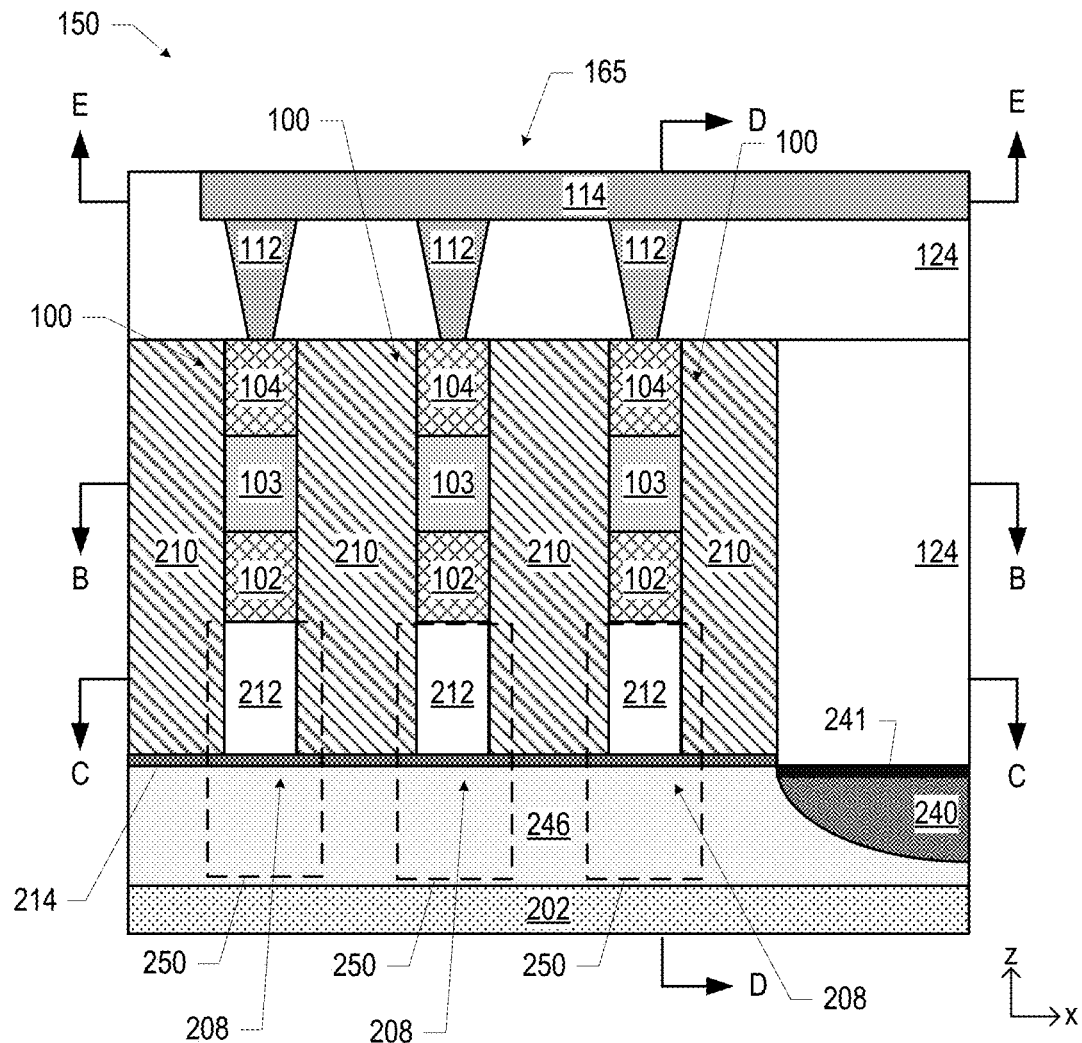
FIGS. 5A-5E are various views of another example quantum dot device including an array of quantum dot gates and an array of vertical selectors, in accordance with various embodiments.
Figure 5B:
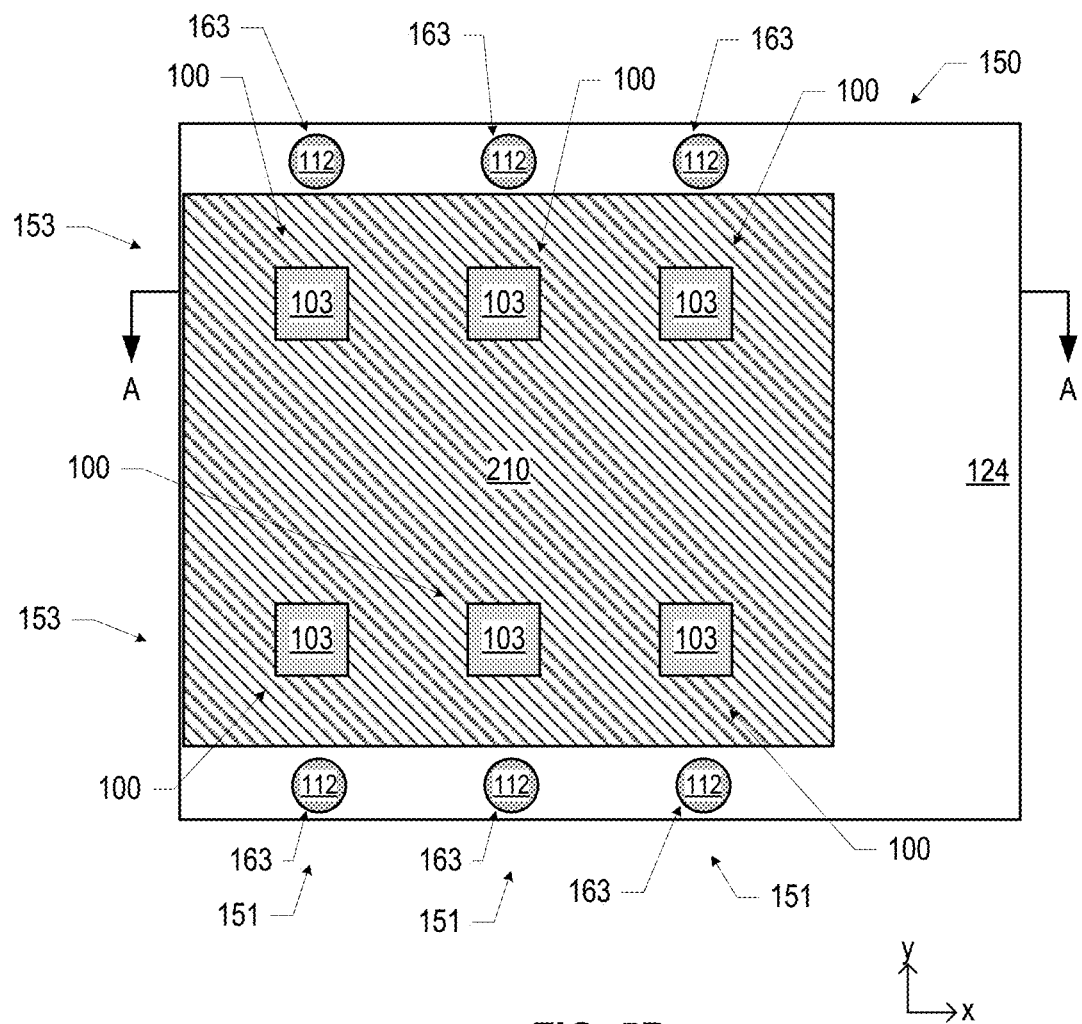
Figure 5C:
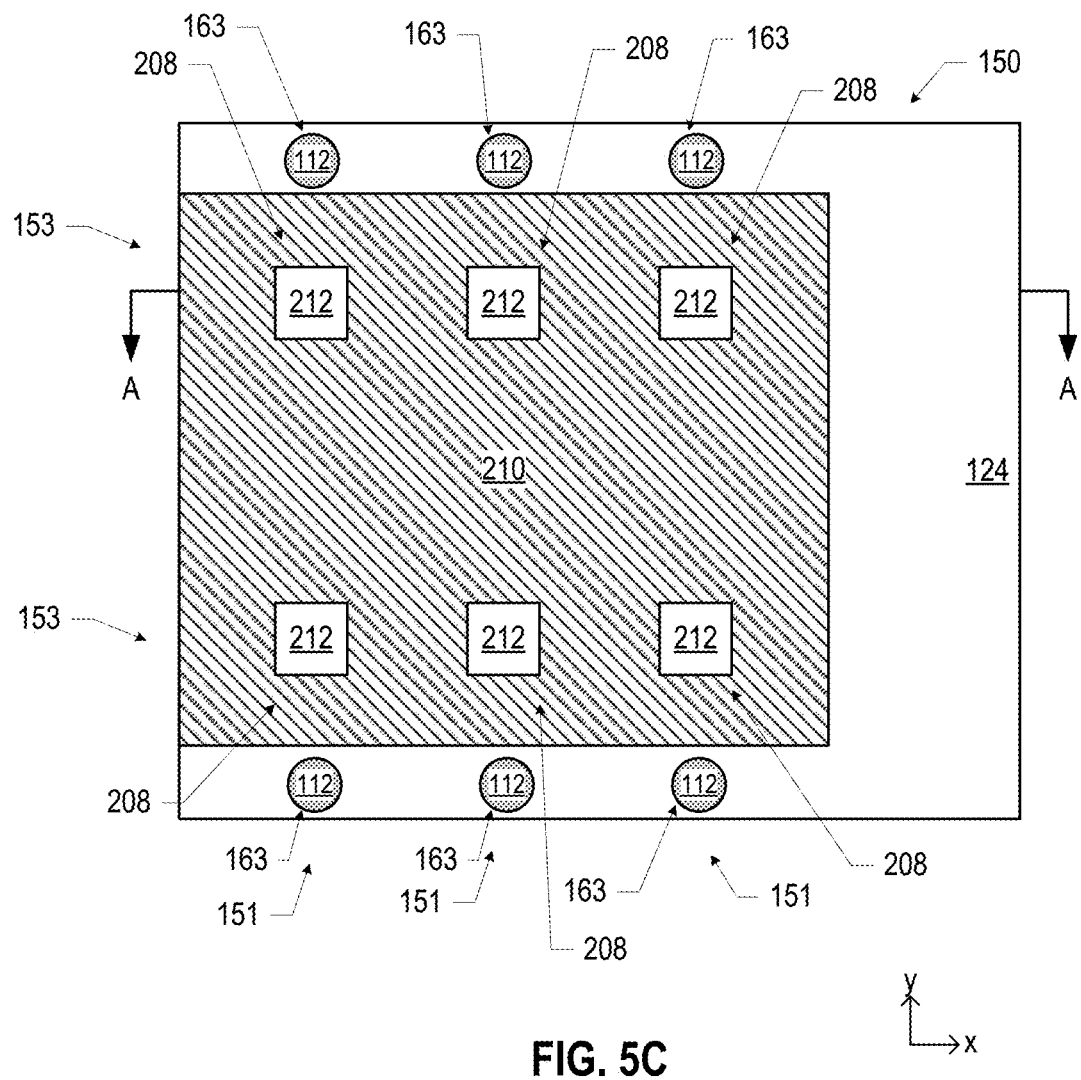
Figure 5D:
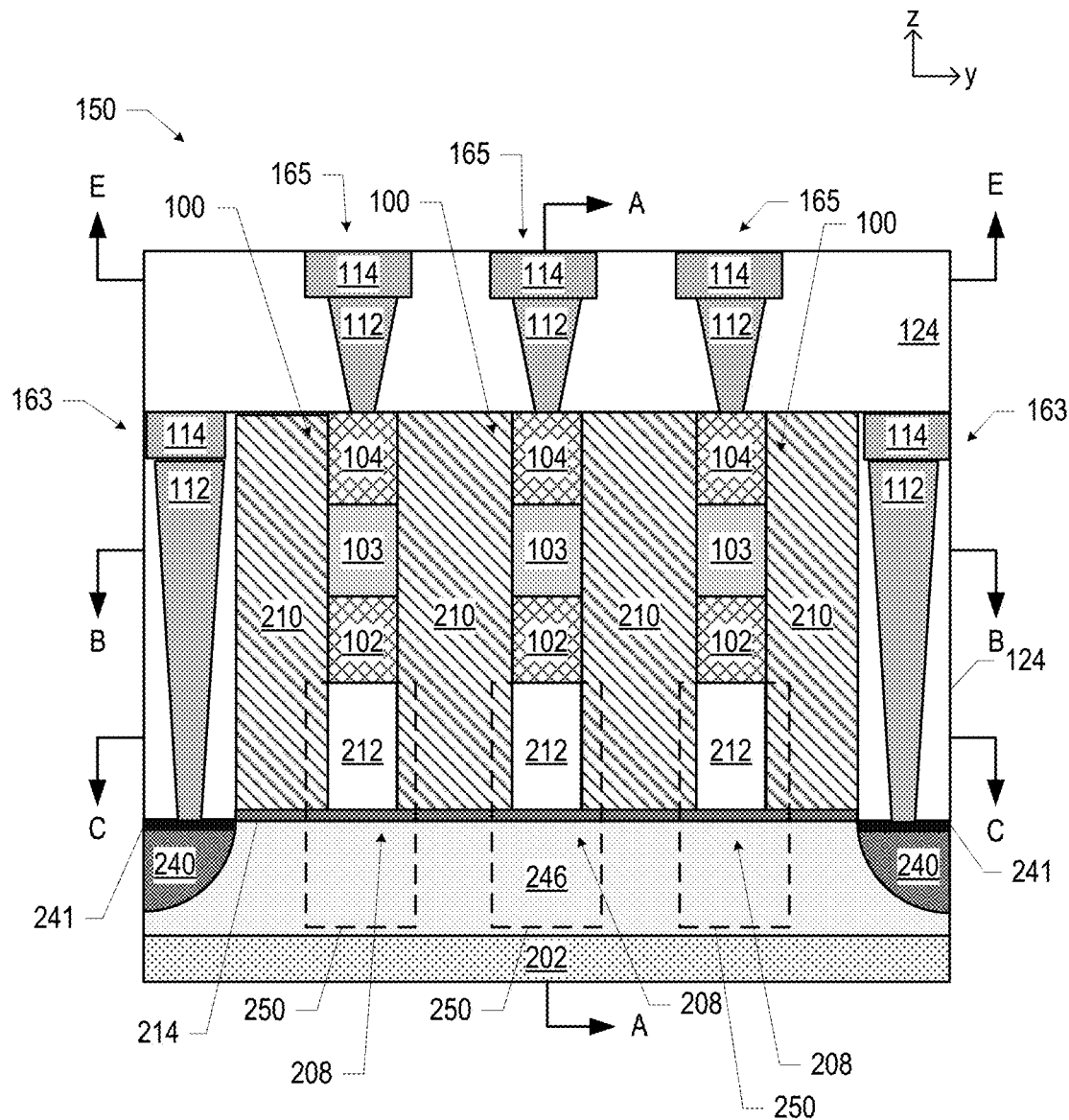
Figure 5E:
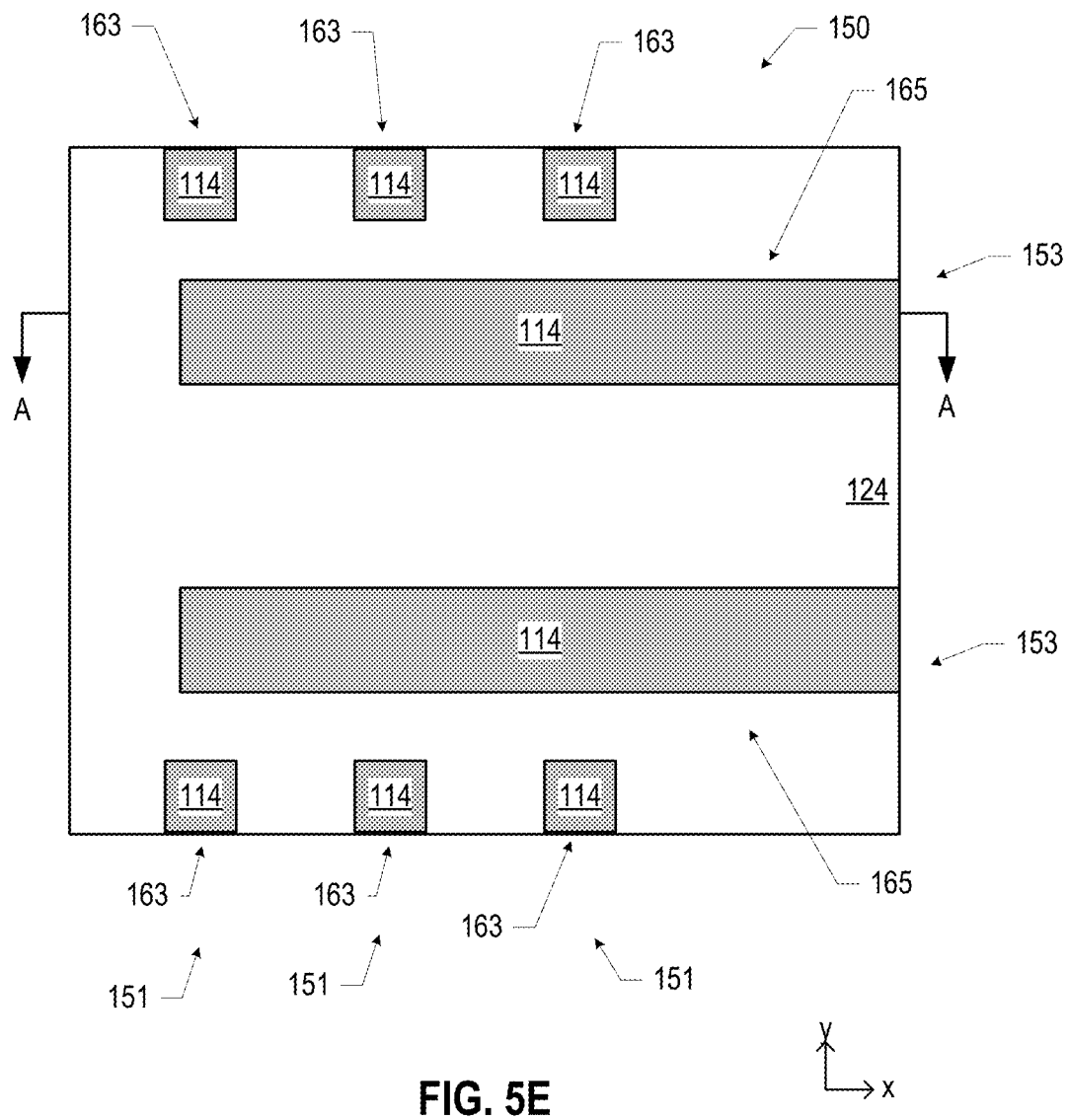

As noted above, in some embodiments, a quantum dot device 150 may not include gate electrodes 106 proximate to the selector material 103 of the vertical selectors 100. In such embodiments, the vertical selectors 100 may be two-terminal devices. FIGS. 4A-4E are cross-sectional views of an example quantum dot device 150 including a vertical selector 100, in accordance with various embodiments. In particular, FIG. 4A is a "side" cross-sectional view (through the section A-A of FIGS. 4B-4E), FIG. 4B is a "top" cross-sectional view (through the section B-B of FIGS. 4A and 4D), FIG. 4C is a "top" cross-sectional view (through the section C-C of FIG. 4A), FIG. 4D is a "side" cross-sectional view (through the section D-D of FIG. 4A), and FIG. 4E is a "top" view with the conductive pathways 165 and 167 and the interface material 241 removed. FIGS. 5A-5E are cross-sectional views of an example quantum dot device 150 including an array of vertical selectors 100 and an array of quantum dot gates 208, in accordance with various embodiments. In particular, FIG. 5A is a "side" cross-sectional view (through the section A-A of FIGS. 5B-5E), FIG. 5B is a "top" cross-sectional view (through the section B-B of FIGS. 5A and 5D), FIG. 5C is a "top" cross-sectional view (through the section C-C of FIG. 5A), FIG. 5D is a "side" cross-sectional view (through the section D-D of FIG. 5A), and FIG. 5E is a "top" cross-sectional view (through the section E-E of FIG. 5A). The quantum dot devices 150 of FIGS. 4 and 5 may be manufactured using the techniques discussed above with FIG. 2, for example, omitting the operations related to the deposition and patterning of the gate electrode 106 and gate dielectric 108. In embodiments in which no gate electrode 106/gate dielectric 108 is present, the insulating material 210 may extend up along the side faces of the selector material 103 and the contact 104 (e.g., as shown in FIGS. 4 and 5).

Figure 6A:
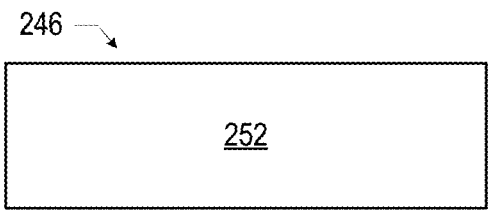
FIGS. 6A-6C illustrate various embodiments of a quantum well stack that may be included in a quantum dot device, in accordance with various embodiments.
Figure 6B:
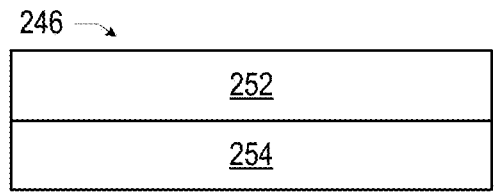
Figure 6C:
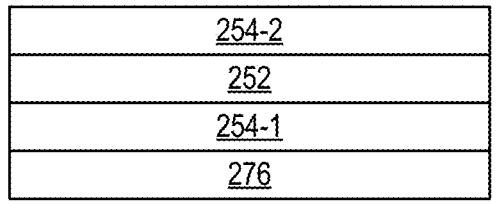

FIGS. 6A-6C illustrate various examples of quantum well stacks 246 that may provide the quantum well stacks 246 of any of the embodiments of the quantum dot devices 150 disclosed herein. In some embodiments, the layers of the quantum well stacks 246 may be grown on a substrate (e.g., a silicon or germanium wafer), and on each other, by epitaxy. Generally, the quantum well stack 246 included in a quantum dot device 150 may include one quantum well layer 252 or more than two quantum well layers 252; elements may be omitted from the quantum well stacks 246, or added to the quantum well stacks 246, discussed with reference to FIG. 6 to achieve such embodiments, as appropriate. Layers other than the quantum well layer(s) 252 in a quantum well stack 246 may have higher threshold voltages for conduction than the quantum well layer(s) 252 so that when the quantum well layer(s) 252 are biased at their threshold voltages, the quantum well layer(s) 252 conduct and the other layers of the quantum well stack 246 do not. This may avoid parallel conduction in both the quantum well layer(s) 252 and the other layers, and thus avoid compromising the strong mobility of the quantum well layer(s) 252 with conduction in layers having inferior mobility. In some embodiments, silicon used in a quantum well stack 246 may be isotopically enriched $^{28}Si$. In some embodiments, germanium used in a quantum well stack 246 may be isotopically enriched $^{70}Ge$, $^{72}Ge$, or $^{74}Ge$.

FIG. 6A is a cross-sectional view of a quantum well stack 246 including only a quantum well layer 252. The quantum well layer 252 may be formed of a material such that, during operation of the quantum dot device 150, a 2DEG may form in the quantum well layer 252 proximate to the upper surface of the quantum well layer 252. The quantum dot gate dielectric 214 may be disposed on the upper surface of the quantum well layer 252. In some embodiments, the quantum well layer 252 of FIG. 6A may be formed of intrinsic silicon, and the quantum dot gate dielectric 214 may be formed of silicon oxide; in such an arrangement, during use of the quantum dot device 150, a 2DEG may form in the intrinsic silicon at the interface between the intrinsic silicon and the silicon oxide. Embodiments in which the quantum well layer 252 of FIG. 6A is formed of intrinsic silicon may be particularly advantageous for electron-type quantum dot devices 150. In some embodiments, the quantum well layer 252 of FIG. 6A may be formed of intrinsic germanium, and the quantum dot gate dielectric 214 may be formed of germanium oxide; in such an arrangement, during use of the quantum dot device 150, a 2DEG may form in the intrinsic germanium at the interface between the intrinsic germanium and the germanium oxide. Such embodiments may be particularly advantageous for hole-type quantum dot devices 150. In some embodiments, the quantum well layer 252 may be strained, while in other embodiments, the quantum well layer 252 may not be strained. The thicknesses (i.e., z-heights) of the layers in the quantum well stack 246 of FIG. 6A may take any suitable values. For example, in some embodiments, the thickness of the quantum well layer 252 (e.g., intrinsic silicon or germanium) may be between 0.8 microns and 1.2 microns.

FIG. 6B is a cross-sectional view of a quantum well stack 246 including a quantum well layer 252 and a barrier layer 254. The quantum well stack 246 may be disposed on a substrate such that the barrier layer 254 is disposed between the quantum well layer 252 and the substrate. The barrier layer 254 may provide a potential barrier between the quantum well layer 252 and the substrate. As discussed above with reference to FIG. 6A, the quantum well layer 252 of FIG. 6B may be formed of a material such that, during operation of the quantum dot device 150, a 2DEG may form in the quantum well layer 252 proximate to the upper surface of the quantum well layer 252. For example, in some embodiments in which the substrate is formed of silicon, the quantum well layer 252 of FIG. 6B may be formed of silicon, and the barrier layer 254 may be formed of silicon germanium. The germanium content of this silicon germanium may be 20-80% (e.g., 30%). In some embodiments in which the quantum well layer 252 is formed of germanium, the barrier layer 254 may be formed of silicon germanium (with a germanium content of 20-80% (e.g., 70%)). The thicknesses (i.e., z-heights) of the layers in the quantum well stack 246 of FIG. 6B may take any suitable values. For example, in some embodiments, the thickness of the barrier layer 254 (e.g., silicon germanium) may be between 0 nanometers and 400 nanometers. In some embodiments, the thickness of the quantum well layer 252 (e.g., silicon or germanium) may be between 5 nanometers and 30 nanometers.

FIG. 6C is a cross-sectional view of a quantum well stack 246 including a quantum well layer 252 and a barrier layer 254-1, as well as a buffer layer 276 and an additional barrier layer 254-2. The quantum well stack 246 may be disposed on a substrate such that the buffer layer 276 is disposed between the barrier layer 254-1 and the substrate. The buffer layer 276 may be formed of the same material as the barrier layer 254, and may be present to trap defects that form in this material as it is grown on the substrate. In some embodiments, the buffer layer 276 may be grown under different conditions (e.g., deposition temperature or growth rate) from the barrier layer 254-1. In particular, the barrier layer 254-1 may be grown under conditions that achieve fewer defects than the buffer layer 276. In some embodiments in which the buffer layer 276 includes silicon germanium, the silicon germanium of the buffer layer 276 may have a germanium content that varies from the substrate to the barrier layer 254-1; for example, the silicon germanium of the buffer layer 276 may have a germanium content that varies from zero percent at the substrate to a nonzero percent (e.g., 30%) at the barrier layer 254-1. The thicknesses (i.e., z-heights) of the layers in the quantum well stack 246 of FIG. 6C may take any suitable values. For example, in some embodiments, the thickness of the buffer layer 276 (e.g., silicon germanium) may be between 0.3 microns and 4 microns (e.g., 0.3-2 microns, or 0.5 microns). In some embodiments, the thickness of the barrier layer 254-1 (e.g., silicon germanium) may be between 0 nanometers and 400 nanometers. In some embodiments, the thickness of the quantum well layer 252 (e.g., silicon or germanium) may be between 5 nanometers and 30 nanometers (e.g., 10 nanometers). The barrier layer 254-2, like the barrier layer 254-1, may provide a potential energy barrier around the quantum well layer 252, and may take the form of any of the embodiments of the barrier layer 254-1. In some embodiments, the thickness of the barrier layer 254-2 (e.g., silicon germanium) may be between 25 nanometers and 75 nanometers (e.g., 32 nanometers).

As discussed above with reference to FIG. 6B, the quantum well layer 252 of FIG. 6C may be formed of a material such that, during operation of the quantum dot device 150, a 2DEG may form in the quantum well layer 252 proximate to the upper surface of the quantum well layer 252. For example, in some embodiments in which the substrate is formed of silicon, the quantum well layer 252 of FIG. 6C may be formed of silicon, and the barrier layer 254-1 and the buffer layer 276 may be formed of silicon germanium. In some such embodiments, the silicon germanium of the buffer layer 276 may have a germanium content that varies from the substrate to the barrier layer 254-1; for example, the silicon germanium of the buffer layer 276 may have a germanium content that varies from zero percent at the substrate to a nonzero percent (e.g., 30%) at the barrier layer 254-1. The barrier layer 254-1 may in turn have a germanium content equal to the nonzero percent. In other embodiments, the buffer layer 276 may have a germanium content equal to the germanium content of the barrier layer 254-1 but may be thicker than the barrier layer 254-1 to absorb the defects that arise during growth.

In some embodiments, the quantum well layer 252 of FIG. 6C may be formed of germanium, and the buffer layer 276 and the barrier layer 254-1 may be formed of silicon germanium. In some such embodiments, the silicon germanium of the buffer layer 276 may have a germanium content that varies from the substrate to the barrier layer 254-1; for example, the silicon germanium of the buffer layer 276 may have a germanium content that varies from zero percent at the substrate to a nonzero percent (e.g., 70%) at the barrier layer 254-1. The barrier layer 254-1 may in turn have a germanium content equal to the nonzero percent. In other embodiments, the buffer layer 276 may have a germanium content equal to the germanium content of the barrier layer 254-1 but may be thicker than the barrier layer 254-1 to absorb the defects that arise during growth. In some embodiments of the quantum well stack 246 of FIG. 6C, the buffer layer 276 and/or the barrier layer 254-2 may be omitted.

As noted above, in some embodiments, the vertical selectors 100 disclosed herein may be included in a quantum dot device 150 with word lines and bit lines. FIG. 7 is a perspective view of a portion of such a quantum dot device 150, in accordance with various embodiments. FIG. 7 is a simplified representation, and the structures therein may take the form of any of the embodiments discussed herein (e.g., with reference to FIGS. 1-6). The quantum dot device 150 of FIG. 7 may be a cross-point array including quantum dot gate cells 131 located at the intersections of conductive lines 145 and conductive lines 143. Conductive vias (not shown) to the conductive lines 145 and the conductive lines 143 may be made at the "edges" of the quantum dot device 150. In some embodiments, the conductive lines 143 may be word lines and the conductive lines 145 may be bit lines, for example; for clarity of discussion, this terminology may be used herein to refer to the conductive lines 143 and the conductive lines 145.

In the embodiments illustrated in FIG. 7, the word lines 143 may be parallel to each other and may be arranged perpendicularly to the bit lines 145 (which themselves may be parallel to each other), but any other suitable arrangement may be used. The word lines 143 and/or the bit lines 145 may be formed of any suitable conductive material, such as a metal (e.g., tungsten, copper, titanium, or aluminum or another superconductor). In some embodiments, the quantum dot device 150 depicted in FIG. 7 may be a portion (e.g., a level) of a three-dimensional array in which other cross-point arrays like the cross-point array of FIG. 7 are located at different levels (e.g., above or below each other).

Each quantum dot gate cell 131 may include a quantum dot structure 250 coupled in series with an associated vertical selector 100. Generally, electrical signals may be provided to a quantum dot gate 208 of a quantum dot structure 250 to generate a qubit with a desired spin state (in a quantum well stack 246), create a barrier between such qubits, or allow multiple qubits to interact, under the control of the vertical selectors 100. In the embodiment of FIG. 7, the contact 102 may be coupled between the selector material 103 (not shown, under the gate electrode 106) and the quantum dot structure 250. The bit lines 145 may be provided by the conductive lines 114 of the conductive pathways 165 of the quantum dot devices 150 discussed herein, and the word lines 143 may be provided by the conductive lines 114 of the conductive pathways 163 of the quantum dot devices 150 discussed herein. Gate electrodes 106 may be oriented in the same direction as the word lines 143 (as shown in FIG. 7), perpendicular to the word lines 143 and in the same direction as the bit lines 145 (not shown), or omitted (not shown).

Any of the quantum dot devices 150 disclosed herein may include one or more magnet lines. As used herein, a "magnet line" refers to a magnetic-field-generating structure to influence (e.g., change, reset, scramble, or set) the spin states of quantum dots formed in the quantum well stack 246. One example of a magnet line, as discussed herein, is a conductive pathway that is proximate to an area of quantum dot formation and selectively conductive of a current pulse that generates a magnetic field to influence a spin state of a quantum dot in the area.

Figure 8:
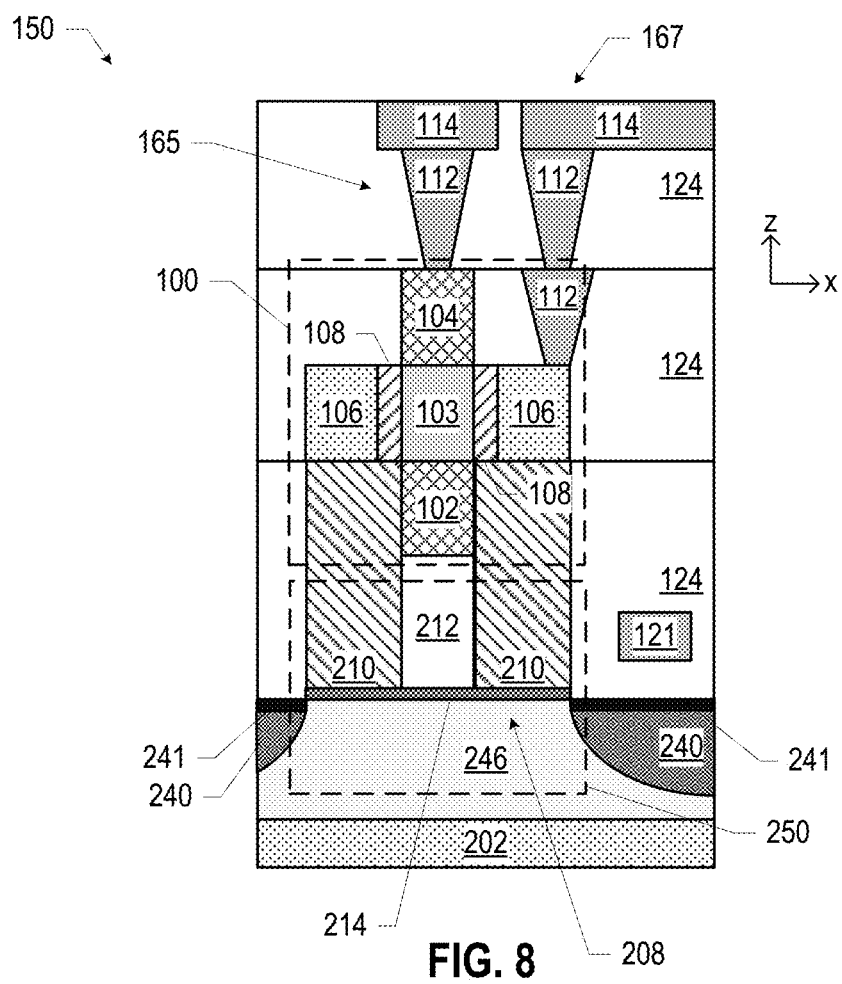
FIG. 8 is a side cross-sectional view of an example quantum dot device including a magnet line, in accordance with various embodiments.

For example, FIG. 8 is a side cross-sectional view of a quantum dot device 150 including a magnet line 121; the magnet line 121 may extend into and out of the plane of the drawing. A magnet line 121 may be formed of a conductive material, and may be used to conduct current pulses that generate magnetic fields to influence the spin states of one or more of the quantum dots that may form in the quantum dot device 150. Alternatively or additionally, a magnet line 121 may be formed of a magnetic material (e.g., cobalt) and may exert a "permanent" magnetic field. In some embodiments, a magnet line 121 may conduct a pulse to reset (or "scramble") quantum dot spins. In some embodiments, a magnet line 121 may conduct a pulse to initialize an electron in a quantum dot in a particular spin state. In some embodiments, a magnet line 121 may conduct current to provide a continuous, oscillating magnetic field to which the spin of a qubit may couple. A magnet line 121 may provide any suitable combination of these embodiments, or any other appropriate functionality.

In some embodiments, a magnet line 121 may be formed of copper. In some embodiments, a magnet line 121 may be formed of a superconductor, such as aluminum. In some embodiments, a magnet line 121 may be formed of a magnetic material. For example, a magnetic material (such as cobalt) may be deposited in a trench in the insulating material 124 to provide a permanent magnetic field in the quantum dot device 150. A magnet line 121 may have any suitable dimensions. For example, the magnet line 121 may have a thickness and/or width between 25 nanometers and 100 nanometers. In some embodiments, the width and thickness of a magnet line 121 may be equal to the width and thickness, respectively, of other conductive lines in the quantum dot device 150 used to provide electrical interconnects (e.g., the conductive lines 114), and may be formed using any processes known for forming conductive lines (e.g., plating in a trench, followed by planarization, or a semi-additive process). The magnet line 121 illustrated in FIG. 8 is substantially linear, but this need not be the case; magnet lines 121 may take any suitable shape. Conductive vias (not shown) may contact the magnet lines 121 at desired locations.

In some embodiments, a quantum dot device 150 may include one magnet line 121, or no magnet lines 121; in other embodiments, a quantum dot device 150 may include two, three, four, or more magnet lines 121. Magnet lines 121 included in a quantum dot device 150 may be oriented in any desired manner relative to the quantum dot gates 208 or other structural features of the quantum dot device 150; for example, one or more magnet lines 121 may be oriented from left to right according to the perspective of FIG. 8, in addition to or instead of one or more magnet lines 121 oriented in and out of the plane of the drawing of FIG. 8.

Figure 9:
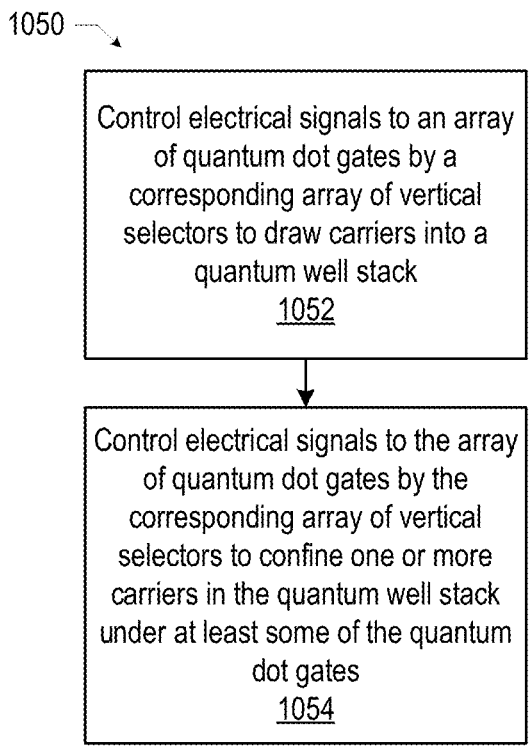
FIG. 9 is a flow diagram of an illustrative method of operating a quantum dot device, in accordance with various embodiments.

FIG. 9 is a flow diagram of an illustrative method 1050 of operating a quantum dot device, in accordance with various embodiments. Although the operations discussed below with reference to the method 1050 (and the other methods disclosed herein) are illustrated in a particular order and depicted once each, these operations may be repeated or performed in a different order (e.g., in parallel), as suitable. Additionally, various operations may be omitted, as suitable. Various operations of the method 1050 (and the other methods disclosed herein) may be illustrated with reference to one or more of the embodiments discussed above, but the method 1050 may be used to operate any suitable quantum dot device (including any suitable ones of the embodiments disclosed herein).

At 1052, electrical signals to an array of quantum dot gates may be controlled by a corresponding array of vertical selectors to draw carriers into a quantum well stack. In some embodiments, a bit line may be in electrical contact with a contact of individual vertical selectors, and a word line may be in electrical contact with region of the quantum well stack under individual quantum dot gates (e.g., as discussed above); an individual one of the quantum dot gates may be "addressed" (e.g., electrical signals may be selectively applied to the associated quantum dot gate electrode) using the word lines and bit lines associated with the quantum dot gate. As noted above, the "word line" and "bit line" designations may be reversed. For example, a quantum dot gate cell 131 may include a quantum dot structure 250 and a vertical selector 100; the vertical selector 100 may control electrical signals to the quantum dot structure 250 to draw carriers into the quantum well stack.

At 1054, electrical signals to the array of quantum dot gates may be controlled by the array of corresponding vertical selectors to confine one or more carriers in the quantum well stack under at least some of the quantum dot gates. For example, a quantum dot gate cell 131 may include quantum dot structures 250 and vertical selectors 100; the vertical selectors 100 may control electrical signals to the quantum dot gates 208 of the quantum dot structures 250 to confine one or more carriers in the quantum well stack under at least some of the quantum dot gates 208 (e.g., by addressing desired ones of the quantum dot gates 208 via their associated vertical selectors 100 and word lines/bit lines).

Figure 10:
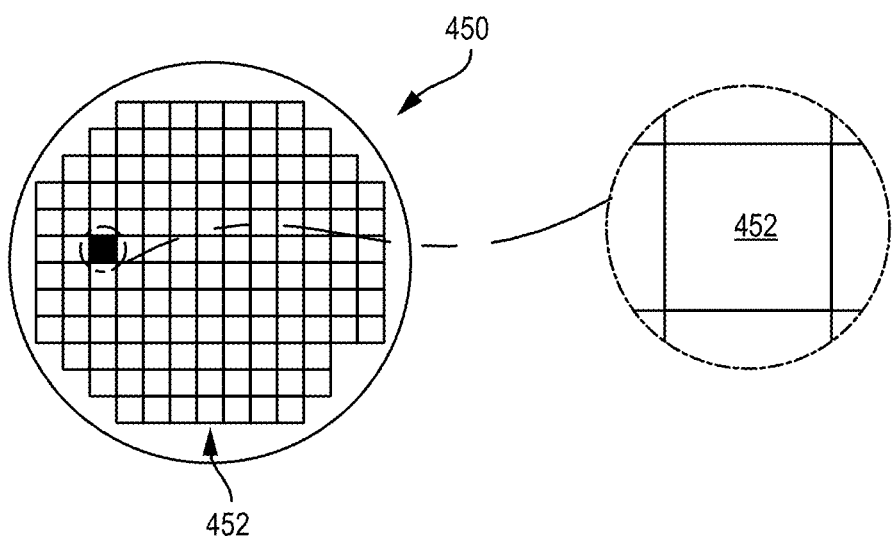
FIG. 10 shows a top view of a wafer and dies that may include any of the quantum dot devices disclosed herein.

The quantum dot devices 150 disclosed herein may be included in any suitable apparatus. FIG. 10 shows top views of a wafer 450 and dies 452 that may be formed from the wafer 450; the dies 452 may include any of the quantum dot devices 150 disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which the dies 452 are separated from one another to provide discrete "chips" of the semiconductor product. A die 452 may include one or more quantum dot devices 150 and/or supporting circuitry to route electrical signals to the quantum dot devices, as well as any other integrated circuit (IC) components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 12) or other logic that is configured to store information in the memory devices or execute instructions stored in the memory array.

Figure 11:
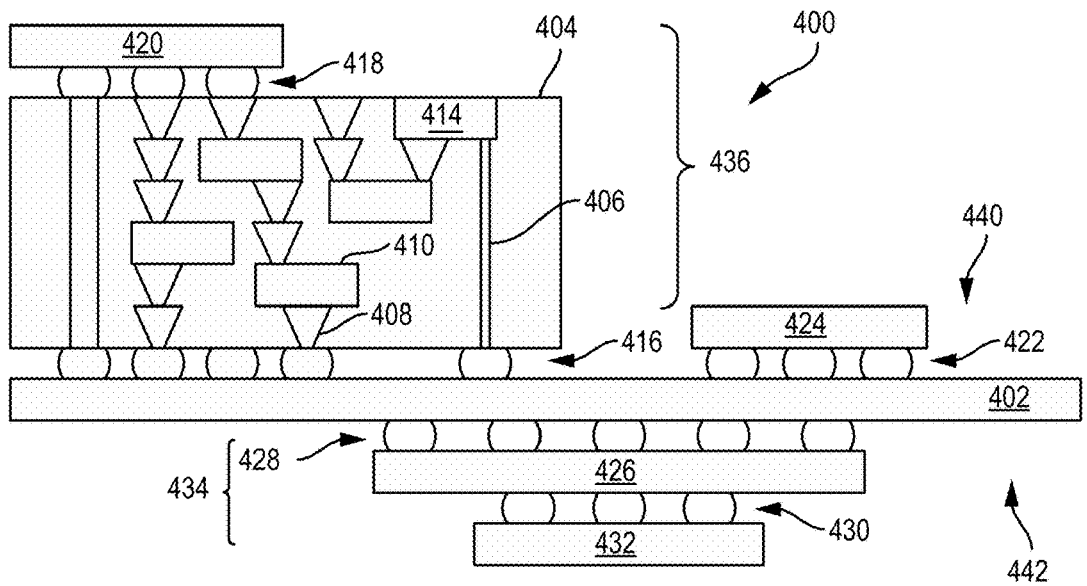
FIG. 11 is a cross-sectional side view of a device assembly that may include any of the dot devices disclosed herein.

FIG. 11 is a cross-sectional side view of a device assembly 400 that may include any of the embodiments of the quantum dot devices 150 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 11 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 11), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 11, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package (e.g., a package that includes one or more quantum dot devices 150) or may be a conventional IC package, for example. In some embodiments, the package 420 may include a quantum dot device die (e.g., a die that includes one or more quantum dot devices 150) coupled to a package substrate (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 11, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package (e.g., a package that includes one or more quantum dot devices 150) or may be a conventional IC package, for example. In some embodiments, the package 424 may include a quantum dot device die (e.g., a die that includes one or more quantum dot devices 150) coupled to a package substrate (e.g., by flip chip connections).

The device assembly 400 illustrated in FIG. 11 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package (e.g., a package that includes one or more quantum dot devices 150) or may be a conventional IC package, for example. In some embodiments, one or both of the packages 426 and 432 may take the form of any of the embodiments of a quantum dot device package (e.g., a package that includes one or more quantum dot devices 150) disclosed herein, and may include a die coupled to a package substrate (e.g., by flip chip connections).

Figure 12:
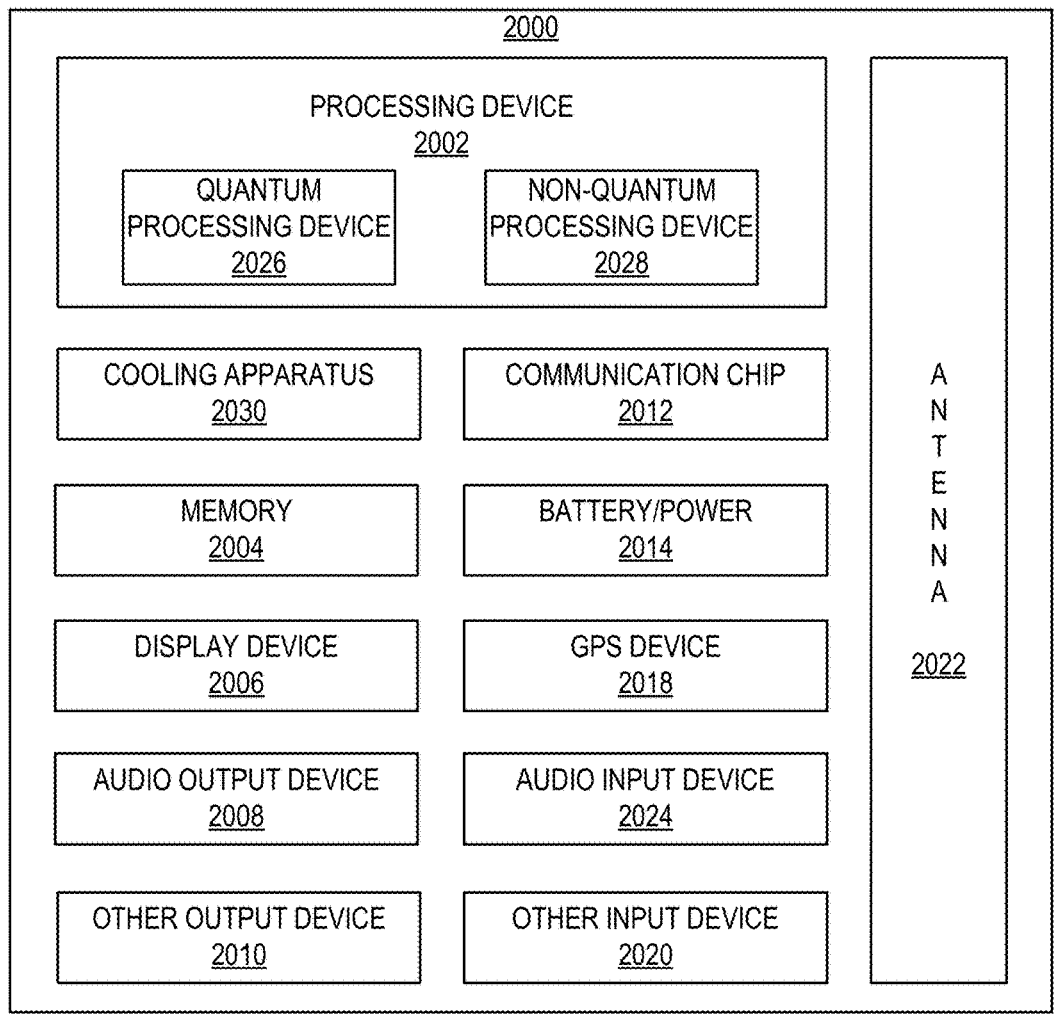
FIG. 12 is a block diagram of an example computing device that may include any of the quantum dot devices disclosed herein, in accordance with various embodiments.

FIG. 12 is a block diagram of an example quantum computing device 2000 that may include any of the quantum dot devices 150 disclosed herein. A number of components are illustrated in FIG. 12 as included in the quantum computing device 2000, but any one or more of these components may be omitted or duplicated, as suitable for the application. In some embodiments, some or all the components included in the quantum computing device 2000 may be attached to one or more PCBs (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 12, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 150 disclosed herein, and may perform data processing by performing operations on the quantum dots that may be generated in the quantum dot devices 150, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output selector materials, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, control the performance of any of the operations discussed above with reference to FIGS. 6A-C, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 10 Kelvin or less (e.g., 5 Kelvin or less, or 2 Kelvin or less). In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications selector materials, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a GPS device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a quantum dot device, including: a quantum well stack; a quantum dot gate electrode above the quantum well stack; and a selector above the quantum dot gate electrode, wherein the selector includes a first contact, a second contact, and a selector material between the first contact and the second contact, and wherein the first contact is electrically coupled to the quantum dot gate electrode.

Example 2 may include the subject matter of Example 1, and may further specify that the quantum dot gate electrode is a first quantum dot gate electrode, the selector is a first selector, and the quantum dot device further includes: a second quantum dot gate electrode above the quantum well stack; and a second selector above the second quantum dot gate electrode, wherein the second selector includes a first contact, a second contact, and a selector material between the first contact and the second contact of the second selector, and wherein the first contact of the second selector is electrically coupled to the second quantum dot gate electrode.

Example 3 may include the subject matter of Example 2, and may further specify that the second contact of the first selector is electrically coupled to the second contact of the second selector.

Example 4 may include the subject matter of Example 3, and may further specify that the quantum dot device further includes: a third quantum dot gate electrode above the quantum well stack; and a third selector above the third quantum dot gate electrode, wherein the third selector includes a first contact, a second contact, and a selector material between the first contact and the second contact of the third selector, wherein the first contact of the third selector is electrically coupled to the third quantum dot gate electrode, and wherein the second contact of the third selector is electrically coupled to the second contact of the second selector.

Example 5 may include the subject matter of any of Examples 2-4, and may further include: an accumulation region; a first pair of conductive pathways in contact with the accumulation region, wherein the first quantum dot gate electrode is at least partially between the conductive pathways in the first pair of conductive pathways; and a second pair of conductive pathways in contact with the accumulation region, wherein the second quantum dot gate electrode is at least partially between the conductive pathways in the second pair of conductive pathways.

Example 6 may include the subject matter of any of Examples 1-5, and may further include: a selector gate electrode; and a selector gate dielectric between the selector material and the selector gate electrode.

Example 7 may include the subject matter of Example 6, and may further specify that the selector gate dielectric wraps around the selector material, and the selector gate electrode wraps around the selector gate dielectric.

Example 8 may include the subject matter of any of Examples 6-7, and may further specify that the quantum dot gate electrode is a first quantum dot gate electrode, the selector is a first selector, the selector gate electrode is a first selector gate electrode, the selector gate dielectric is a first selector gate dielectric, and the quantum dot device further includes: a second quantum dot gate electrode above the quantum well stack; a second selector above the second quantum dot gate electrode, wherein the second selector includes a selector material; a second selector gate electrode; and a second selector gate dielectric between the selector material of the second selector and the second selector gate electrode; wherein the second selector gate electrode is materially continuous with the first selector gate electrode.

Example 9 may include the subject matter of Example 8, and may further specify that the quantum dot device further includes: a third quantum dot gate electrode above the quantum well stack; a third selector above the third quantum dot gate electrode, wherein the third selector includes a selector material; a third selector gate electrode; and a third selector gate dielectric between the selector material of the third selector and the third selector gate electrode; wherein the third selector gate electrode of the second selector is not materially continuous with the first selector gate electrode.

Example 10 may include the subject matter of any of Examples 1-9, and may further specify that the selector material includes an oxide material.

Example 11 may include the subject matter of any of Examples 1-10, and may further specify that the selector material includes a chalcogenide material.

Example 12 may include the subject matter of any of Examples 1-11, and may further specify that the selector material includes a group IV element or a group VI element.

Example 13 may include the subject matter of any of Examples 1-12, and may further specify that the selector material includes an ovonic material.

Example 14 may include the subject matter of any of Examples 1-13, and may further specify that a bit line is coupled to the second contact.

Example 15 may include the subject matter of Example 14, and may further specify that a word line is coupled to an accumulation region.

Example 16 may include the subject matter of any of Examples 1-15, and may further specify that the quantum well stack includes a layer of silicon or a layer of germanium, and the layer of silicon or the layer of germanium is in contact with a layer of quantum dot gate dielectric between the quantum dot gate electrode and the layer of silicon or the layer of germanium.

Example 17 may include the subject matter of any of Examples 1-16, and may further specify that the quantum well stack includes silicon and germanium.

Example 18 may include the subject matter of Example 17, and may further specify that the quantum well stack includes a quantum well layer including a layer of silicon or a layer of germanium, the quantum well stack includes a barrier layer including silicon and germanium, and the barrier layer is between the quantum well layer and the quantum dot gate electrode.

Example 19 may include the subject matter of any of Examples 1-18, and may further include a magnet line.

Example 20 is a method of manufacturing a quantum dot device, including: forming a quantum well stack; forming an array of quantum dot gate electrodes above the quantum well stack; and forming an array of selectors above the array of quantum dot gate electrodes.

Example 21 may include the subject matter of Example 20, and may further specify that forming the array of quantum dot gate electrodes and forming the array of selectors includes: depositing a quantum dot gate electrode material above the quantum well stack; depositing a selector material above the quantum dot gate electrode material; and simultaneously patterning the quantum dot gate electrode material and the selector material to form the array of quantum dot gate electrodes and the array of selectors.

Example 22 may include the subject matter of Example 21, and may further include: before depositing the selector material, depositing a first contact material; and after depositing the selector material, depositing a second contact material; wherein simultaneously patterning the quantum dot gate electrode material and the selector material includes simultaneously patterning the quantum dot gate electrode material, the first contact material, the selector material, and the second contact material to form the array of quantum dot gate electrodes and the array of selectors.

Example 23 may include the subject matter of any of Examples 20-22, and may further include: forming a selector gate dielectric on side faces of selector material of the selector; after forming the selector gate dielectric; depositing a selector gate electrode material; and patterning the selector gate electrode material such that a portion of the selector gate electrode material is materially continuous around multiple ones of the selectors, but is not materially continuous around all the selectors.

Example 24 may include the subject matter of any of Examples 20-23, and may further include forming an accumulation region in the quantum well stack.

Example 25 is a method of operating a quantum dot device, including: controlling electrical signals to an array of quantum dot gates, through an array of selectors, to draw carriers into a quantum well stack under the array of quantum dot gates; and controlling electrical signals to the array of quantum dot gates, through the array of selectors, to confine one or more carriers in the quantum well stack under at least some of the quantum dot gates; wherein the array of selectors is above the array of quantum dot gates.

Example 26 may include the subject matter of Example 25, and may further specify that each selector in the array of selectors is associated with one word line and one bit line.

Example 27 may include the subject matter of any of Examples 25-26, and may further include controlling electrical signals through one or more magnet lines to change a spin state of a carrier under at least one of the quantum dot gate electrodes.

Example 28 is a quantum computing device, including: a quantum processing device, wherein the quantum processing device includes a quantum well stack, an array of quantum dot gate electrodes above the quantum well stack, and an associated array of selectors above the array of quantum dot gate electrodes, wherein the array of quantum dot gate electrodes and the array of selectors are each arranged in a grid, and the grids have a same pitch.

Example 29 may include the subject matter of Example 28, and may further include: a non-quantum processing device, coupled to the quantum processing device, to control electrical signals applied to the quantum dot gate electrodes; and a memory device to store data generated by the quantum processing device.

Example 30 may include the subject matter of any of Examples 28-29, and may further include a plurality of word/bit lines, wherein different individual word/bit lines electrically connect contacts in different individual rows of selectors in the array of selectors.

Example 31 may include the subject matter of Example 30, and may further specify that the plurality of word/bit lines is a plurality of first word/bit lines, and the quantum computing device further includes a plurality of second word/bit lines, wherein different individual second word/bit lines electrically connect portions of the quantum well stack under quantum dot gate electrodes in different individual columns of quantum dot gate electrodes in the array of quantum dot gate electrodes.

Example 32 may include the subject matter of Example 31, and may further include a plurality of gate lines, wherein different individual gate lines electrically connect selector material in different individual rows of selectors in the array of selectors.

Example 33 may include the subject matter of any of Examples 31-32, and may further include a plurality of gate lines, wherein different individual gate lines electrically connect selector material in different individual columns of selectors in the array of selectors.

The invention claimed is:

1. A quantum dot device, comprising:
   a quantum well stack;
   a quantum dot gate electrode above the quantum well stack; and
   a selector above the quantum dot gate electrode, wherein the selector includes a first contact, a second contact, and a selector material between the first contact and the second contact, and wherein the first contact is electrically coupled to the quantum dot gate electrode.

2. The quantum dot device of claim 1, wherein the quantum dot gate electrode is a first quantum dot gate electrode, the selector is a first selector, and the quantum dot device further includes:
   a second quantum dot gate electrode above the quantum well stack; and
   a second selector above the second quantum dot gate electrode, wherein the second selector includes a first contact, a second contact, and a selector material between the first contact and the second contact of the second selector, and wherein the first contact of the second selector is electrically coupled to the second quantum dot gate electrode.

3. The quantum dot device of claim 2, wherein the second contact of the first selector is electrically coupled to the second contact of the second selector.

4. The quantum dot device of claim 3, wherein the quantum dot device further includes:
   a third quantum dot gate electrode above the quantum well stack; and
   a third selector above the third quantum dot gate electrode, wherein the third selector includes a first contact, a second contact, and a selector material between the first contact and the second contact of the third selector, wherein the first contact of the third selector is electrically coupled to the third quantum dot gate electrode, and wherein the second contact of the third selector is electrically coupled to the second contact of the second selector.

5. The quantum dot device of claim 2, further comprising:
   an accumulation region;
   a first pair of conductive pathways in contact with the accumulation region, wherein the first quantum dot gate electrode is at least partially between the conductive pathways in the first pair of conductive pathways; and
   a second pair of conductive pathways in contact with the accumulation region, wherein the second quantum dot gate electrode is at least partially between the conductive pathways in the second pair of conductive pathways.

6. The quantum dot device of claim 1, further comprising:
   a selector gate electrode; and
   a selector gate dielectric between the selector material and the selector gate electrode.

7. The quantum dot device of claim 6, wherein the selector gate dielectric wraps around the selector material, and the selector gate electrode wraps around the selector gate dielectric.

8. The quantum dot device of claim 6, wherein the quantum dot gate electrode is a first quantum dot gate electrode, the selector is a first selector, the selector gate electrode is a first selector gate electrode, the selector gate dielectric is a first selector gate dielectric, and the quantum dot device further includes:
   a second quantum dot gate electrode above the quantum well stack;

a second selector above the second quantum dot gate electrode, wherein the second selector includes a selector material;

a second selector gate electrode; and a second selector gate dielectric between the selector material of the second selector and the second selector gate electrode;

wherein the second selector gate electrode is materially continuous with the first selector gate electrode.

9. The quantum dot device of claim 8, wherein the quantum dot device further includes:

a third quantum dot gate electrode above the quantum well stack;

a third selector above the third quantum dot gate electrode, wherein the third selector includes a selector material;

a third selector gate electrode; and a third selector gate dielectric between the selector material of the third selector and the third selector gate electrode;

wherein the third selector gate electrode of the second selector is not materially continuous with the first selector gate electrode.

10. The quantum dot device of claim 1, wherein the selector material includes an oxide material, a chalcogenide material, a group IV element, a group VI element, or an ovonic material.

11. The quantum dot device of claim 1, wherein a bit line is coupled to the second contact.

12. The quantum dot device of claim 11, wherein a word line is coupled to an accumulation region.

\* \* \* \* \*